(12) United States Patent
Song et al.

(10) Patent No.: US 12,140,800 B2
(45) Date of Patent: Nov. 12, 2024

(54) GERMANIUM PHOTODETECTOR EMBEDDED IN A MULTI-MODE INTERFEROMETER

(71) Applicant: Taiwan Semiconductor Manufacturing Co., Ltd., Hsinchu (TW)

(72) Inventors: Weiwei Song, San Jose, CA (US); Stefan Rusu, Sunnyvale, CA (US); Chewn-Pu Jou, Hsinchu (TW); Huan-Neng Chen, Taichung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 27 days.

(21) Appl. No.: 17/808,813

(22) Filed: Jun. 24, 2022

(65) Prior Publication Data

US 2022/0326443 A1 Oct. 13, 2022

Related U.S. Application Data

(62) Division of application No. 16/745,561, filed on Jan. 17, 2020, now Pat. No. 11,378,750.

(51) Int. Cl.
*G02B 6/14* (2006.01)
*G02B 6/122* (2006.01)
(Continued)

(52) U.S. Cl.
CPC ....... *G02B 6/29344* (2013.01); *G02B 6/1228* (2013.01); *G02B 6/29346* (2013.01); *G02B 6/14* (2013.01); *H01S 5/30* (2013.01)

(58) Field of Classification Search
None
See application file for complete search history.

(56) References Cited

U.S. PATENT DOCUMENTS 6,686,620 B2 2/2004 An et al.
8,846,440 B2 9/2014 Assefa et al.
(Continued)

FOREIGN PATENT DOCUMENTS

JP 2018082089 A * 5/2018
TW 201539706 A 10/2015
(Continued)

OTHER PUBLICATIONS

Translation of JP2018082089A (Year: 2018).*
(Continued)

*Primary Examiner* — Chad H Smith
(74) *Attorney, Agent, or Firm* — Slater Matsil, LLP

(57) ABSTRACT

A method includes etching a silicon layer to form a silicon slab and an upper silicon region over the silicon slab, and implanting the silicon slab and the upper silicon region to form a p-type region, an n-type region, and an intrinsic region between the p-type region and the n-type region. The method further includes etching the p-type region, the n-type region, and the intrinsic region to form a trench. The remaining portions of the upper silicon region form a Multi-Mode Interferometer (MMI) region. An epitaxy process is performed to grow a germanium region in the trench. Electrical connections are made to connect to the p-type region and the n-type region.

18 Claims, 20 Drawing Sheets

(51) Int. Cl.
*G02B 6/293* (2006.01)
*H01S 5/30* (2006.01)

(56) References Cited

U.S. PATENT DOCUMENTS

| | | |
|---|---|---|
| 9,703,043 B2 | 7/2017 | Chen et al. |
| 9,806,221 B2 | 10/2017 | Shank et al. |
| 9,954,121 B2 | 4/2018 | Cheng et al. |
| 10,546,963 B2 | 1/2020 | Hon et al. |
| 10,605,987 B2 | 3/2020 | Clark et al. |
| 2001/0021299 A1 | 9/2001 | Hamamoto |
| 2007/0116398 A1* | 5/2007 | Pan ............ H01L 27/1443 385/9 |
| 2016/0161691 A1 | 6/2016 | Hayakawa |
| 2018/0172906 A1 | 6/2018 | Rothberg et al. |
| 2020/0012043 A1 | 1/2020 | Abediasl et al. |
| 2020/0124878 A1 | 4/2020 | Yu et al. |

FOREIGN PATENT DOCUMENTS

| | | |
|---|---|---|
| TW | 201631626 A | 9/2016 |
| TW | I568001 B | 1/2017 |
| TW | I615955 B | 2/2018 |
| TW | 201831938 A | 9/2018 |
| TW | 201904034 A | 1/2019 |
| TW | 201904085 A | 1/2019 |
| TW | I648564 B | 1/2019 |
| TW | 201931795 A | 8/2019 |
| TW | 201943072 A | 11/2019 |

OTHER PUBLICATIONS

Alternate translation of JP2018820089A (Year: 2018).*
Piels, et al., "Photodetectors for silicon photonic integrated cicuits," Photodetectors; Materials, Devices and Applications, Dec. 2016, 18 pages.

* cited by examiner

GERMANIUM PHOTODETECTOR EMBEDDED IN A MULTI-MODE INTERFEROMETER

PRIORITY CLAIM AND CROSS-REFERENCE

This application is a divisional of U.S. patent application Ser. No. 16/745,561, entitled "Germanium Photodetector Embedded in a Multi-Mode Interferometer," filed on Jan. 17, 2020, which application is incorporated herein by reference.

BACKGROUND

A photodetector (PD) is a critical device for optical-electrical signal conversion. Germanium PDs are used in sensing and high speed communication, such as Light Detection and Ranging (Lidar), data center, telecommunication, or the like. Germanium has a strong absorption coefficient for the light with wavelength less than about 1.55 μm, which makes it a good material for forming photodetector.

A conventional lateral germanium photodetector may include a P-I-N diode, with a germanium region over and contacting the P-I-N diode. The silicon layer, in which the P-I-N diode is formed, may be etched down so that the sidewalls of the P-I-N diode are in contact with dielectric. The germanium region has the ability of absorbing light, and converting the light into electron-hole pairs. In a conventional germanium photodetector, a germanium region is formed over the P-I-N diode. This type of germanium photodetector, with the input light beam easily diverted too much, has a low responsivity. To solve this problem, the P and N region not overlapped by the germanium region are recessed to form sidewalls, to tightly confine light close to the germanium absorption region, between the P-I-N diode and the dielectric region in which the photodetector is located. This type of germanium photodetector, having the light absorbed by the germanium in short distance, has a low saturation power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
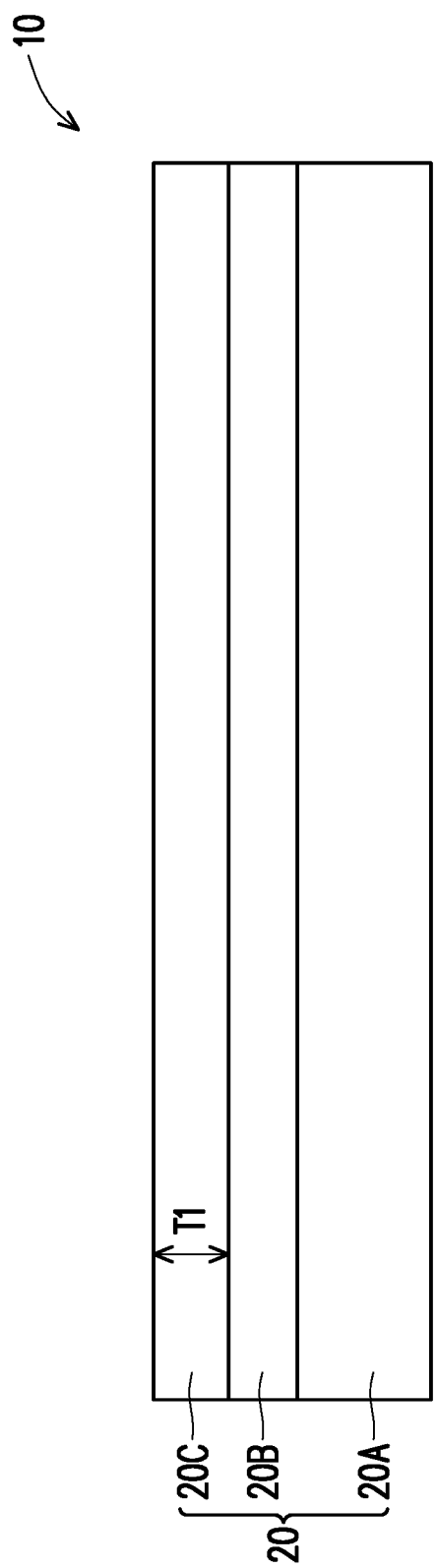
FIGS. 1, 2A, 2B, 3A, 3B, 4-8, 9A, 9B, and 9C illustrate the cross-sectional views and top views of intermediate stages in the formation of a multi-mode germanium photodetector in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A multi-mode germanium photodetector and the method of forming the same are provided in accordance with some embodiments. The intermediate stages in the formation of the multi-mode germanium photodetector are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, the multi-mode germanium photodetector has a germanium region in a Multi-Mode Interferometer (MMI) structure. The MMI structure may be a silicon region that laterally extends beyond the germanium region far enough, so that high-order modes may be excited from a fundamental mode of an input light. The different modes including the fundamental mode and the high-order modes interfere inside the MMI structure, so that the optical field intensity of the light may be redistributed. As a result, instead of having the strongest intensity in the front center section of the germanium region and having most of the light energy absorbed by the front section, the absorption is gradual along the germanium region. This results in the increase in the saturation power of the light and the increase in the speed of the photodetector. It is appreciated that although silicon and germanium are used as example materials, other applicable materials may also be used to form a multi-mode photodetector.

Figure 16:
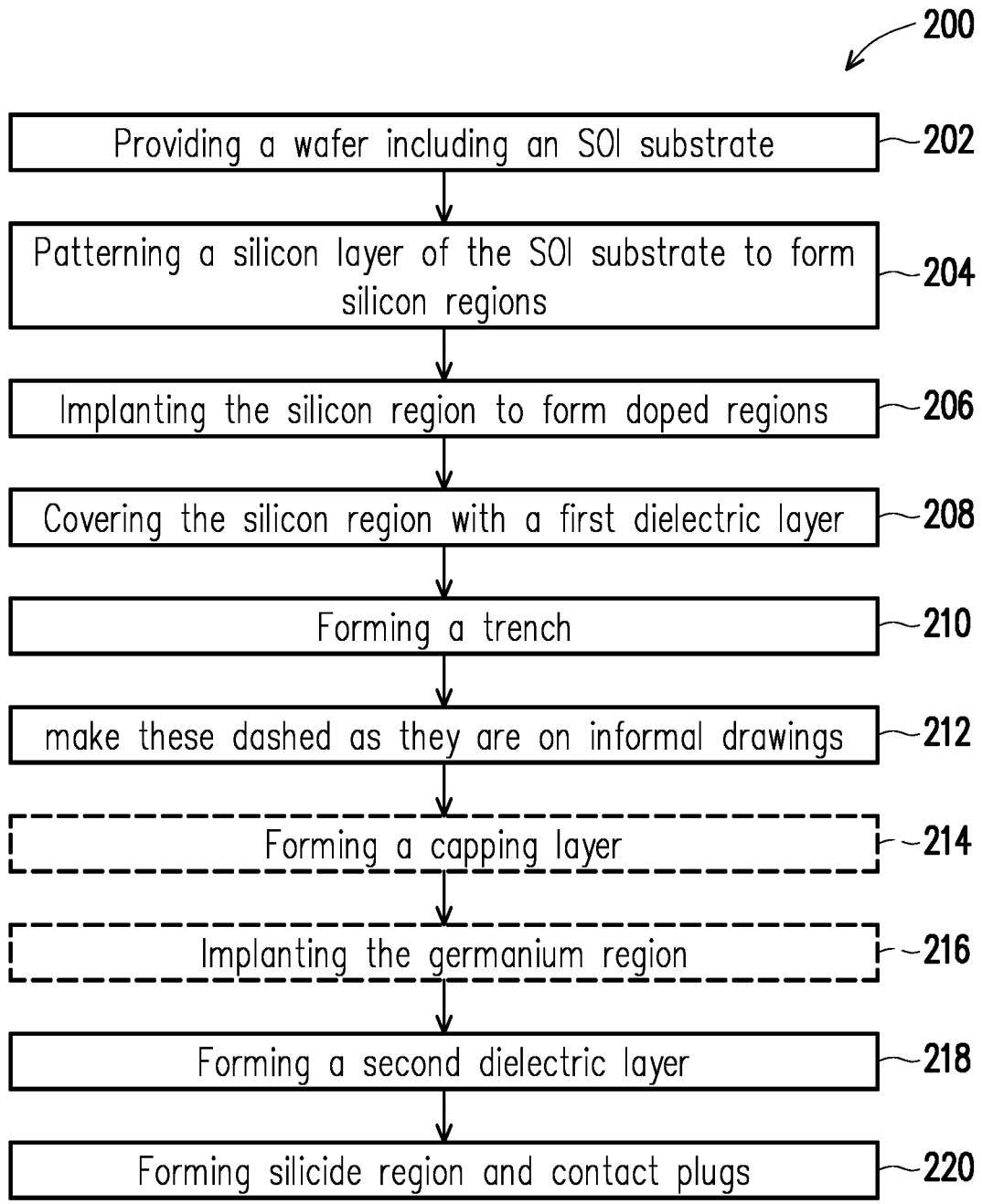
FIG. 16 illustrates a process flow for forming a multi-mode germanium photodetector in accordance with some embodiments.

FIGS. 1, 2A, 2B, 3A, 3B, 4-8, 9A, 9B, and 9C illustrate the cross-sectional views and top views of intermediate stages in the formation of a multi-mode germanium photodetector in accordance with some embodiments of the present disclosure. The corresponding processes are also reflected schematically in the process flow 200 as shown in FIG. 16.

In FIG. 1, wafer 10, which includes substrate 20, is provided. The respective process is illustrated as process 202 in the process flow 200 as shown in FIG. 16. The substrate 20 may have a Semiconductor-On-Insulator (SOI) structure, which includes semiconductor substrate 20A, Buried Oxide (BOX) layer 20B over and joined to semiconductor substrate 20A, and semiconductor layer 20C over and joined to BOX layer 20B. In accordance with some embodiments, the semiconductor material of semiconductor substrate 20A may include silicon; germanium; a compound semiconductor including silicon carbide, gallium arsenic, gallium phosphide, indium phosphide, indium arsenide, and/or indium antimonide; an alloy semiconductor including SiGe, SiC, GaAsP, AlInAs, AlGaAs, GaInAs, GaInP, and/or GaInAsP; or combinations thereof. Substrate 20A may also be formed of other materials such as sapphire, Indium tin oxide (ITO), or the like.

BOX layer 20B may be formed of a dielectric material having a refraction index lower than the refraction index of silicon. In accordance with some embodiments, BOX layer 20B is formed of or comprises silicon oxide. Semiconductor layer 20C may be formed of crystalline silicon, and is referred to as silicon layer 20C hereinafter. In accordance with some embodiments of the present disclosure, silicon layer 20C is not doped with any of p-type and n-type impurity. In accordance with alternative embodiments of the present disclosure, silicon layer 20C is lightly doped with a p-type impurity such as boron, indium, or the like, or an n-type impurity such as phosphorous, arsenic, antimony, or the like. The doping concentration of the lightly doped silicon layer 20C is low, for example, lower than about $5 \times 10^{15}/cm^3$. Throughout the description, the semiconductor layers (regions) that are not doped, or light doped with doping concentration lower than $5 \times 10^{15}/cm^3$) is referred to as intrinsic semiconductor layers (regions). The thickness T1 of silicon layer 20C may in the range between about 0.1 µm and about 1 µm.

Figure 2A:
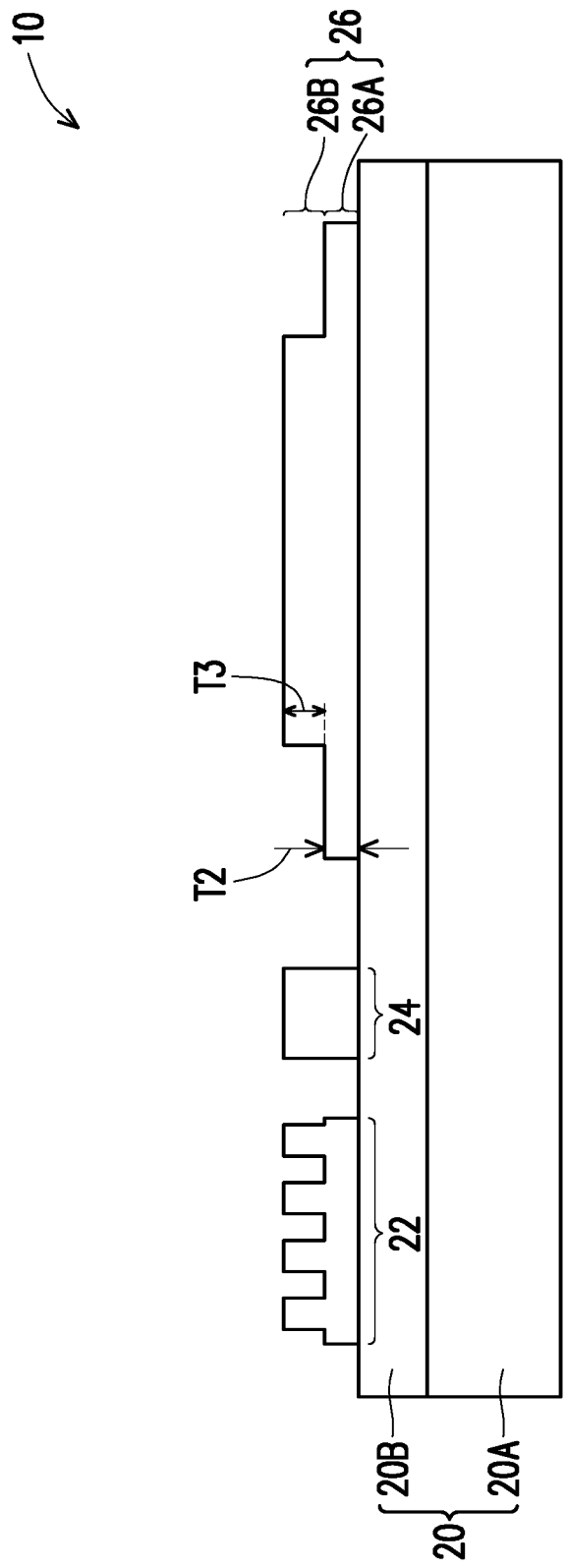

Silicon layer 20C is then patterned, for example, in a plurality of etching processes, so that a plurality of device regions is formed. The respective process is illustrated as process 204 in the process flow 200 as shown in FIG. 16. The example device regions are shown in FIG. 2A, which includes grating coupler 22, waveguide 24, and silicon region 26. Silicon region 26 will be used for forming a multi-mode germanium photodetector in subsequent processes. In accordance with some embodiments, the etching processes for patterning silicon layer 20C include a time-mode etching process to etch some parts of silicon layer 20C, wherein the time-mode etching process is stopped before silicon layer 20C is etched-through. Another etching process is performed to etch-through silicon layer 20C. As a result of the etching processes, silicon region 26 includes silicon slab 26A and upper silicon regions 26B, 26C, and 26D (shown in FIG. 2B) over silicon slab 26A. In accordance with some embodiments of the present disclosure, thickness T2 of silicon slab 26A may be in the range between about 0.05 µm and about 0.5 µm, and thickness T3 of upper silicon regions 26B, 26C, and 26D may be in the range between about 0.05 µm and about 0.5 µm. Ratio T3/T2 may be in the range between about 0.1 and about 10.

Figure 2B:
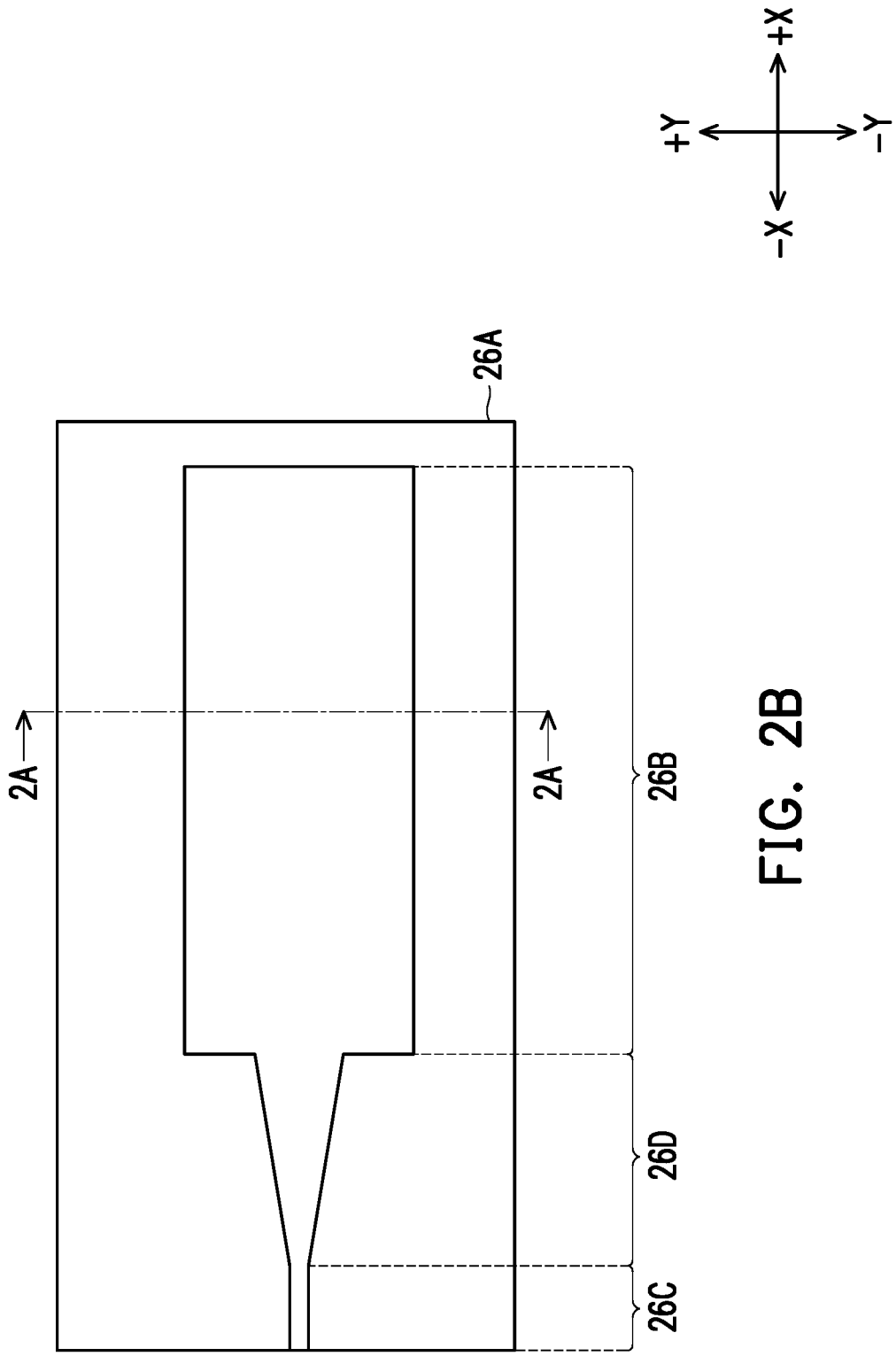

FIG. 2B illustrates a top view of silicon region 26, which includes silicon slab 26A, silicon region 26B, waveguide 26C, and tapered region 26D. The cross-sectional view shown in FIG. 2A is obtained from the reference cross-section 2A-2A as shown in FIG. 2B. Silicon slab 26A may be larger than silicon region 26B, and may extend beyond the edges of silicon region 26B at least in the −X direction, +Y direction, and −Y direction. Silicon slab 26A may or may not extend beyond the edge of silicon region 26B in the +X direction. Throughout the description, silicon region 26B is referred to as a MMI region, as will be discussed in detail in subsequent paragraphs.

Figure 3A:
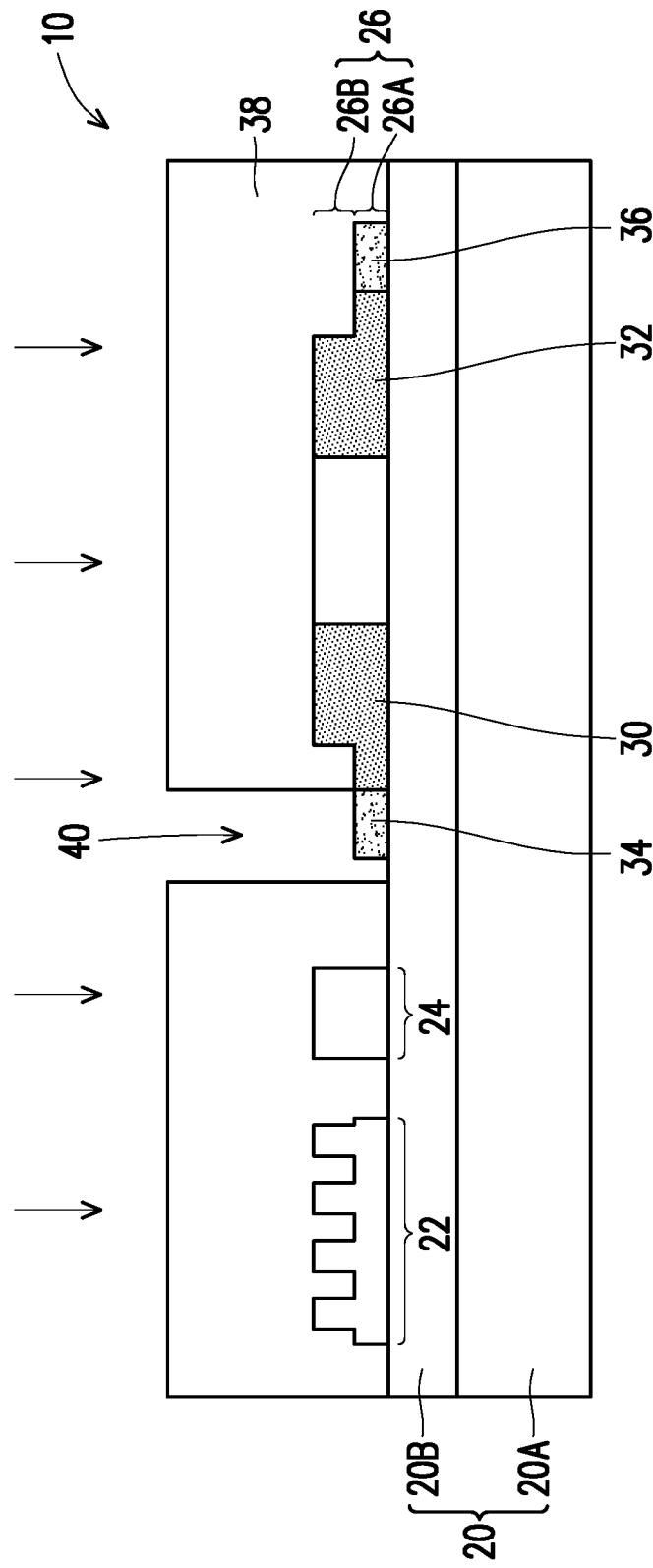

FIG. 3A illustrates the formation of a plurality of doped regions, which includes p-type region 30, n-type region 32, heavily doped p-type (p+) region 34, and heavily doped n-type (n+) region 36. The respective processes are illustrated as process 206 in the process flow 200 as shown in FIG. 16. In accordance with some embodiments, p-type region 30 and n-type region 32 may have respective p-type and n-type impurity concentrations in the range between about $10^{17}/cm^3$ and about $10^{19}/cm^3$. P+ region 34 and n+ region 36 may have respective p-type and n-type impurity concentrations in the range between about $10^{19}/cm^3$ and about $10^{21}/cm^3$. P+ region 34 and n+ region 36 are used as the electric contact regions of the resulting photodetector. Each of the regions 30, 32, 34, and 36 may be implanted using a photo lithography mask. For example, FIG. 3A illustrates the example formation process of p+ region 34, which includes forming patterned photo resist 38, with opening 40 formed to reveal a portion of silicon region 26, and implanting a p-type impurity such as boron and/or indium to form p+ region 34. The photo resist 38 is removed after the implantation.

Figure 3B:
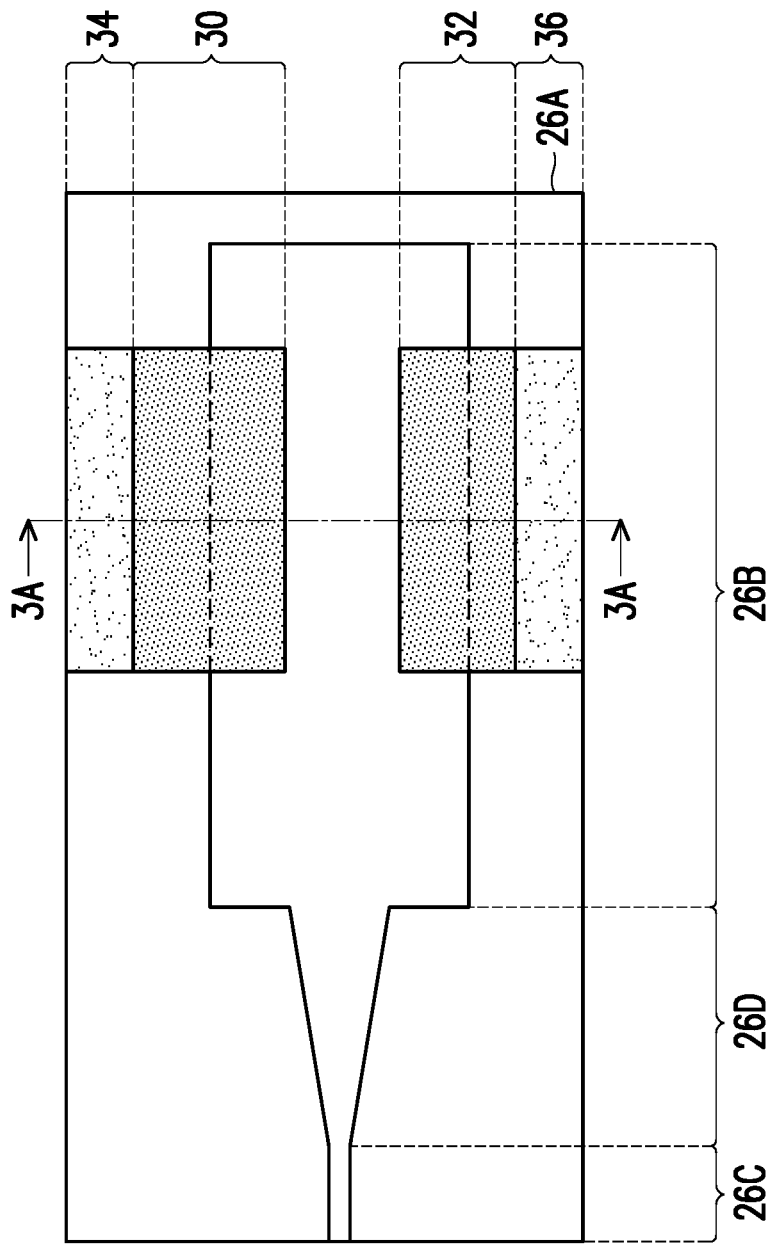

FIG. 3B illustrates a top view of the structure shown in FIG. 3A, wherein the cross-sectional view shown in FIG. 3A is obtained from the reference cross-section 3A-3A as shown in FIG. 3B. As shown in FIG. 3B, some parts of silicon region 26 are implanted, while the rest portions of silicon region 26 are not implanted. The un-implanted portions of silicon region 26, which may include the portions of silicon slab 26A and upper silicon region 26B, may remain intrinsic.

Figure 4:
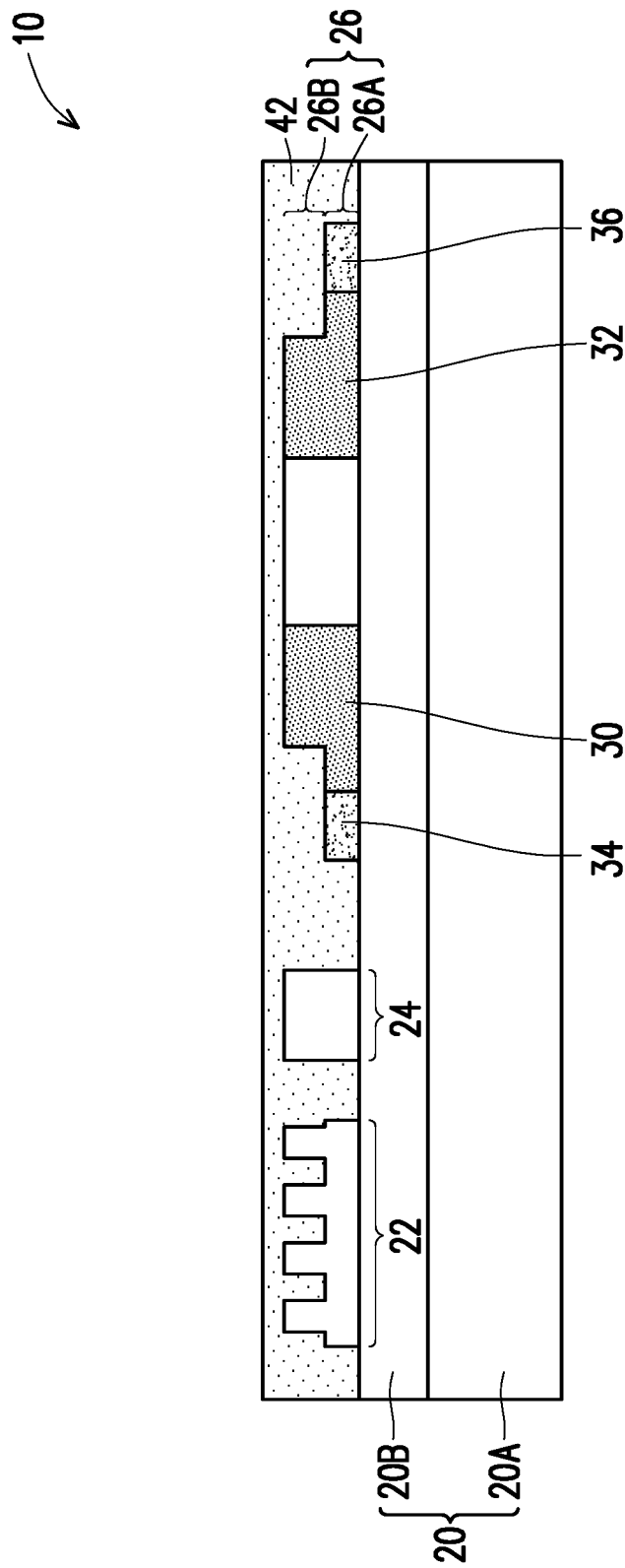

Referring to FIG. 4, dielectric layer 42 is formed on silicon features. The respective process is illustrated as process 208 in the process flow 200 as shown in FIG. 16. In accordance with some embodiments of the present disclosure, dielectric layer 42 is formed of a dielectric material having a refractive index lower than the refractive index of silicon. In accordance with some embodiments, dielectric layer 42 is formed of or comprises silicon oxide ($SiO_2$), silicon oxide nitride (SiON), aluminum oxide ($Al_2O_3$), or the like. Other materials are also within the scope of the present disclosure. The formation of dielectric layer 42 may include Atomic Layer Deposition (ALD), Chemical Vapor Deposition (CVD), Plasma Enhanced Chemical Vapor Deposition (PECVD), or the like. Dielectric layer 42 may include portions covering grating coupler 22, waveguide 24, and silicon region 26. A planarization process such as a Chemical Mechanical Polish (CMP) process or a mechanical grinding process may be performed to planarize the top surface of dielectric layer 42.

Figure 5:
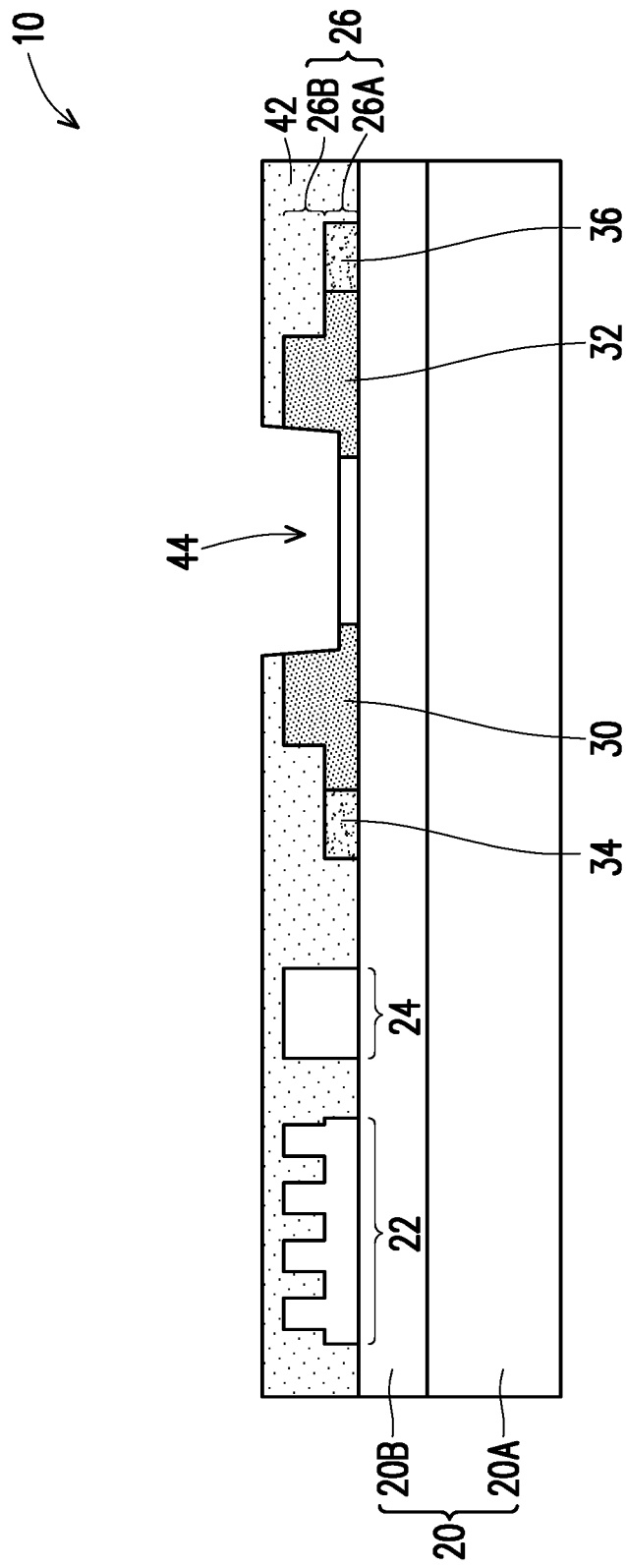

Referring to FIG. 5, silicon region 26 is etched to form trench 44, which extends into the un-doped portion of silicon region 26, p-type region 30, and n-type region 32. The respective process is illustrated as process 210 in the process flow 200 as shown in FIG. 16. The etching may be performed using an anisotropic etching process. In accordance with some embodiments, the etching is performed using $C_2F_6$, $CF_4$, $SO_2$, the mixture of HBr, $Cl_2$, and $O_2$, the mixture of HBr, $Cl_2$, and $O_2$, or the mixture of HBr, $Cl_2$, $O_2$, and CF$_2$ etc. Other materials are also within the scope of the present disclosure. In accordance with some embodiments, the bottom of trench 44 is lower than the top surface of silicon slab 26A. In accordance with other embodiments, the bottom of trench 44 is level with or higher than the top surface of silicon slab 26A.

Figure 6:
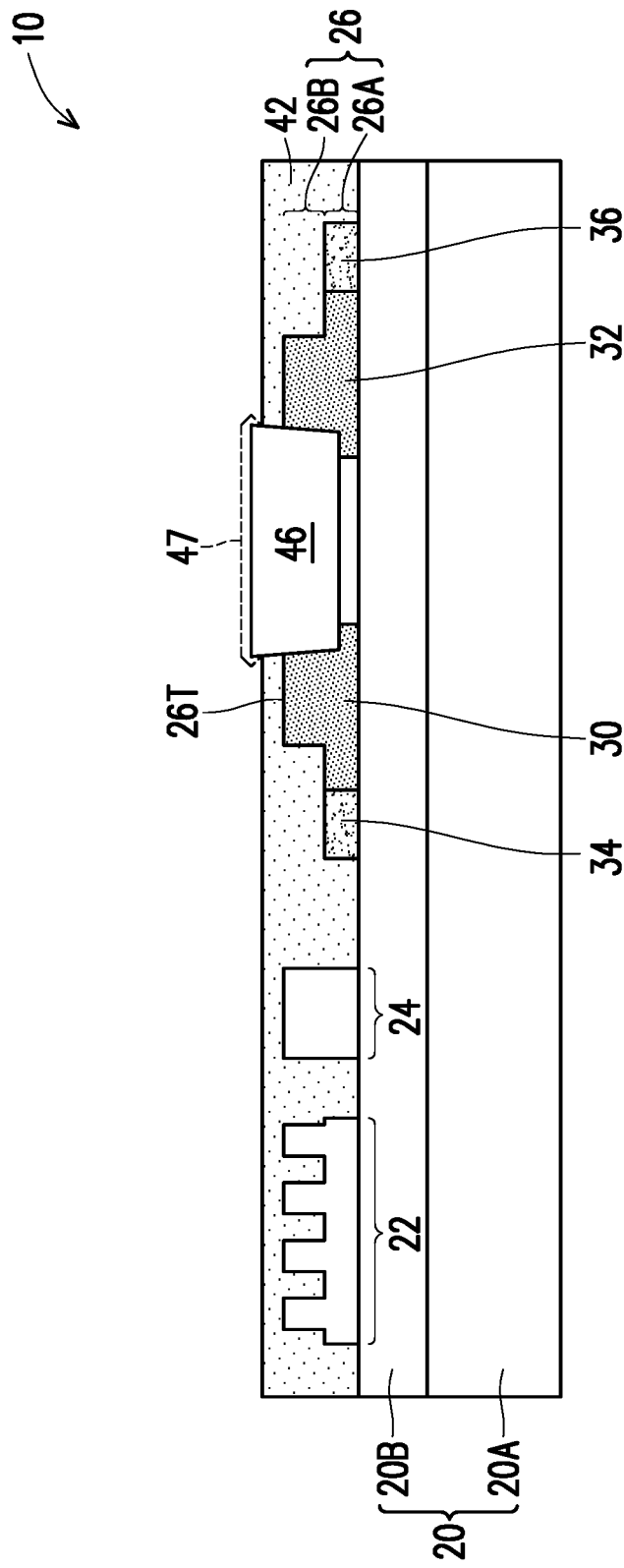

FIG. 6 illustrates the epitaxy process for forming germanium region 46, which is selectively grown from the exposed surfaces of silicon region 26, but not from dielectric layer 42. The respective process is illustrated as process 212 in the process flow 200 as shown in FIG. 16. In accordance with some embodiments, the epitaxy is performed using germane (GeH$_4$) as a process gas, with an etching gas such as HCl added to achieve the selective growth. Germanium region 46 may comprise pure germanium, or substantially pure germanium (for example, with germanium atomic percentage higher than 99 percent). In accordance with some embodiments of the present disclosure, germanium region 46 is intrinsic, with no p-type impurity and no n-type impurity in-situ added during the epitaxy. In accordance with alternative embodiments, germanium region 46 is lightly in-situ doped with p-type and/or n-type impurities, with doping concentration lower than about $1 \times 10^{15}/cm^3$, for example. The epitaxy process is performed until the top surface of germanium region 46 is at least level with or higher than the top surface 26T of silicon region 26. The top surface of germanium region 46 may also be level with or higher than the top surface of dielectric layer 42. For example, FIG. 6 illustrates an example germanium region 46 with the top surface higher than the top surface of dielectric layer 42. Germanium region 46 may have facets, for example, as shown using dashed lines 47. In accordance with some embodiments of the present disclosure, after the epitaxy process, a planarization process is performed to planarize the top surfaces of germanium region 46 and dielectric layer 42. In accordance with alternative embodiments, no planarization process is performed, and the top surface of germanium region 46 may be lower than, level with, or higher than, the top surface of dielectric layer 42.

Figure 7:
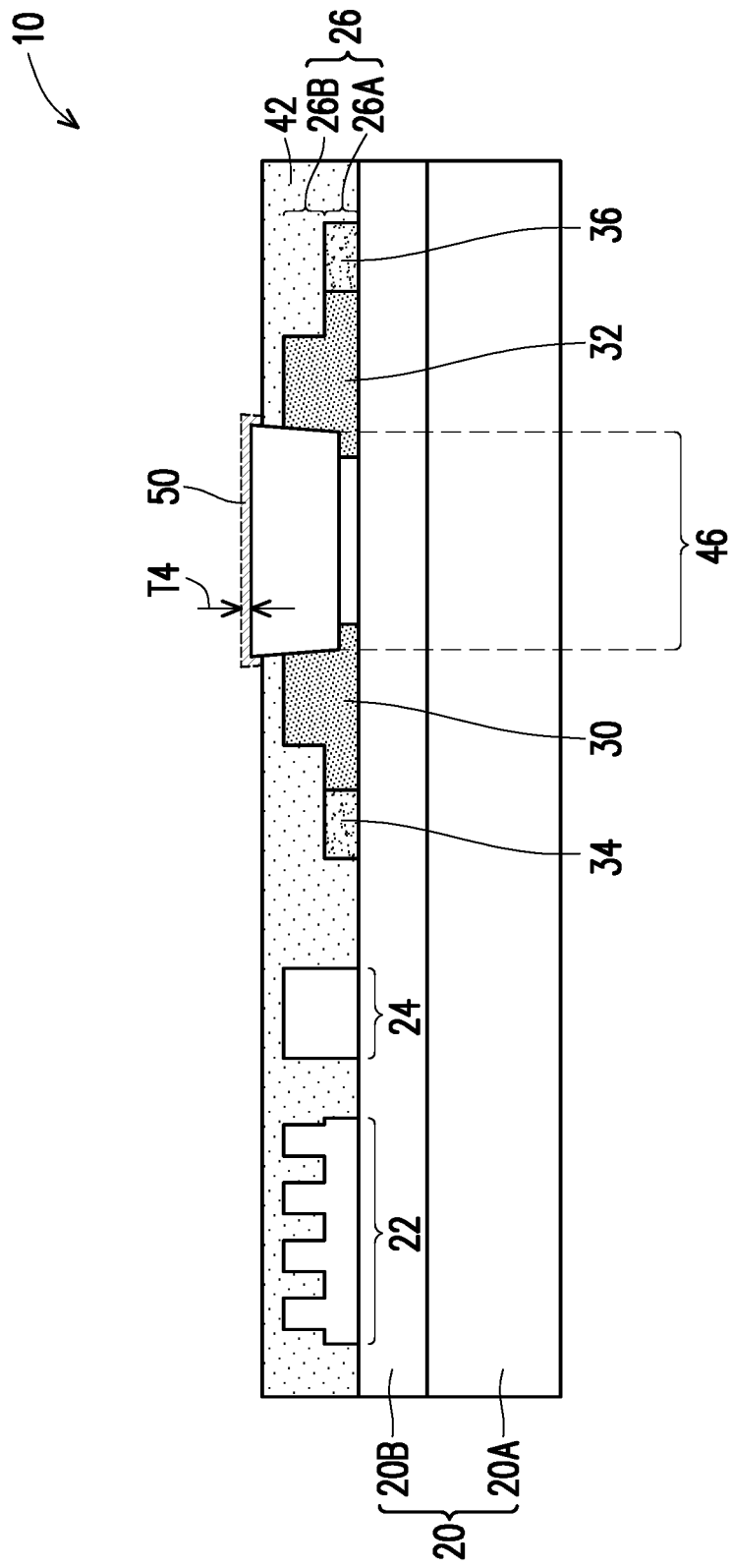

FIG. 7 illustrates the formation of capping layer 50 in accordance with some embodiments of the present disclosure. The respective process is illustrated as process 214 in the process flow 200 as shown in FIG. 16. In accordance with some embodiments, capping layer 50 is formed of a dense material, which may prevent the germanium in germanium region 46 from undesirably diffusing upwardly into, and contaminate, overlying regions. Accordingly, with the formation of the capping layer, the formation process of the present disclosure is more compatible with the formation of other integrated circuits such as transistors. Capping layer 50 may be formed of or comprise silicon nitride, silicon oxide nitride, aluminum oxide, or the like. Other materials are also within the scope of the present disclosure. The thickness of capping layer 50 may be in the range between about 20 nm and about 600 nm.

The material and the formation process of capping layer 50 can be configured to allow capping layer 50 to apply a stress on the underlying germanium region 46. In accordance with some embodiment, the stress is tensile. In accordance with some embodiment, the stress is compressive. The stress may be higher than about 1 Gpa, and may be in the range between about 0.2 Gpa and about 1.7 Gpa. Other values are also within the scope of the present disclosure. A tensile stress can effectively reduce the direct bandgap of Germanium, which translates to an extension of the strong absorption band toward the longer wavelength. For example, with a stress on the level of 0.5 Gpa, the Ge absorption edge can be shifted by 90 nm to the longer wavelength (from ~1550 nm to ~1640 nm), which makes the Ge high absorption band fully covering the c-band used in telecommunication. It is appreciated that whether capping layer 50 applies a stress to germanium region 46, the type (compressive or tensile), and the magnitude of the stress are related to both the material and the formation process of capping layer 50. Both the material and the formation process of capping layer 50 are selected to achieve the desirable stress.

In accordance with some embodiments, the formation of capping layer 50 includes depositing a blanket capping layer, and then patterning the blanket capping layer through etching. An annealing process may be performed to adjust the stress. During the patterning, the portions of the blanket capping layer on dielectric layer 52 are removed. In accordance with alternative embodiments, the formation of capping layer 50 includes selectively depositing an inhibitor film on the surface of dielectric layer 42, for example, through silylation process, and then selectively depositing capping layer 50 on germanium region 46. The inhibitor film may prevent the formation of capping layer 50 on dielectric layer 42. The inhibitor film may be removed through annealing.

Figure 8:
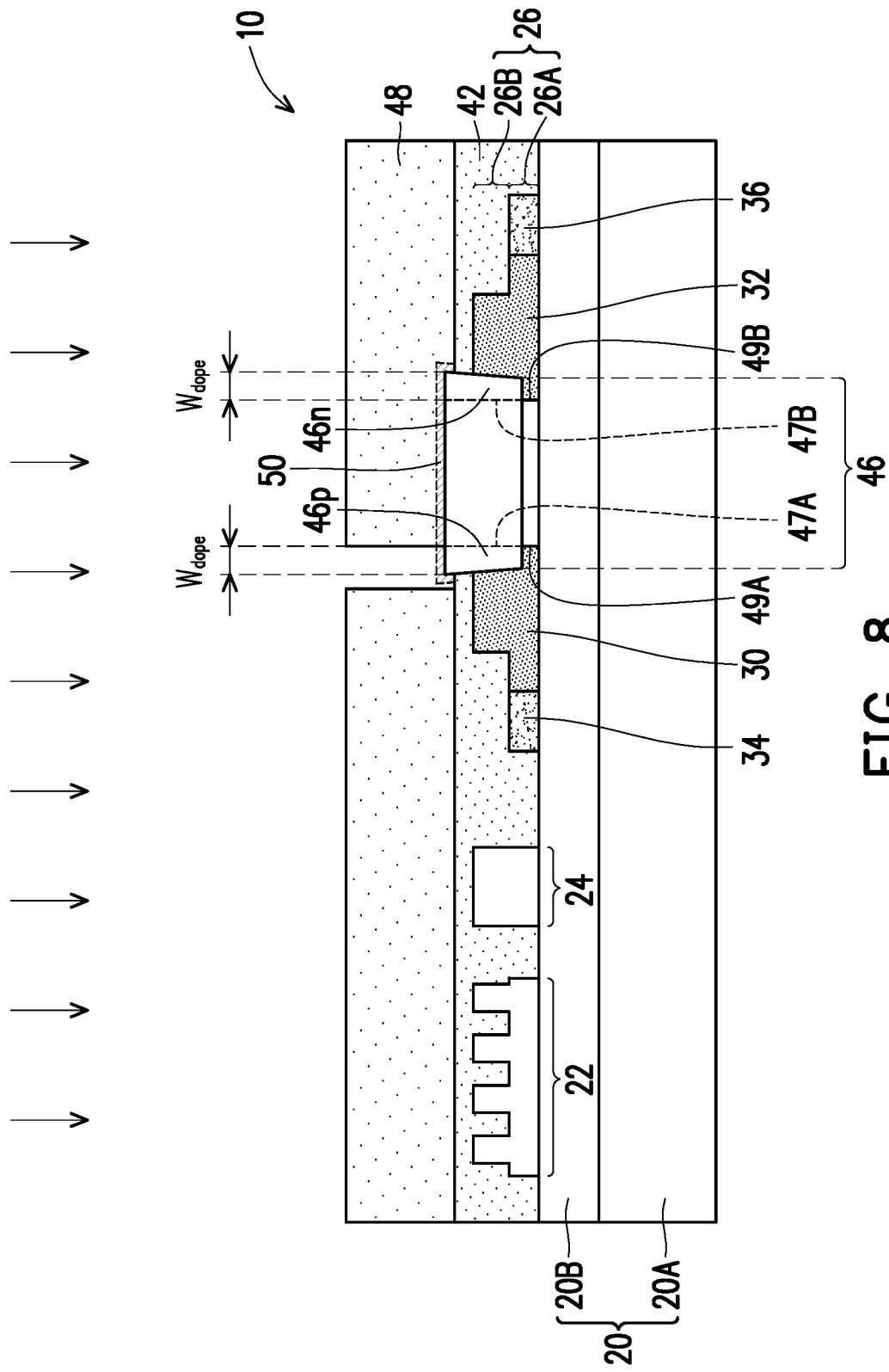

FIG. 8 illustrates the implantation process to form p-type region 46p in germanium region 46. The respective process is illustrated as process 216 in the process flow 200 as shown in FIG. 16. In accordance with some embodiments, the formation of p-type region 46p may include forming patterned implantation mask 48 (such as a photo resist) to define the implantation region, and implanting a p-type impurity such as boron and/or indium into an edged portion of germanium region 46. The doping of the edge portion of germanium region 46 as p-type region 46p may reduce the barrier height between germanium region 46 and p-type silicon region 30.

FIG. 8 also illustrates the formation of n-type region 46n in germanium region 46. The respective process is also illustrated as process 216 in the process flow 200 as shown in FIG. 16. In accordance with some embodiments, the formation of n-type region 46n may include forming a patterned implantation mask (not shown) to define the implantation region, and implanting an n-type impurity such as phosphorous, arsenic, etc., into an edged portion of germanium region 46. The doping of germanium region 46 as n-type region 46n may reduce the barrier height between germanium region 46 and n-type silicon region 32. In accordance with some embodiments of the present disclosure, both of p-type region 46p and n-type region 46n are formed. In accordance with alternative embodiments, p-type region 46p is formed, while n-type region 46n is not formed since the p-type region 46p is more efficient in improving device performance than n-type region 46n if one, not both, is to be formed for reducing manufacturing cost. In yet other embodiments, neither one of p-type region 46p and n-type region 46n is formed. Accordingly, dashed lines are used to mark the boundaries of p-type region 46p and n-type region 46n and to indicate that they may, or may not, be formed.

It is appreciated that the interface 47A between p-type germanium region 46p and the undoped portion of germanium region 46 may or may not be aligned to the interface 49A between the p-type silicon region 30 and the undoped portion of silicon region 26. Accordingly, interface 47A may be offset to the left, aligned with, or offset to the right, of interface 49A. Similarly, the interface 47B between n-type germanium region 46n and the undoped portion of germanium region 46 may or may not be aligned to the interface 49B between the n-type silicon region 32 and the undoped portion of silicon region 26. Accordingly, interface 47B may be offset to the left, aligned with, or offset to the right, of interface 49B.

The doping concentrations of p-type germanium region 46p and n-type germanium region 46n may be smaller than about $5 \times 10^{19}/cm^3$, and may be in the range between about $1 \times 10^{16}/cm^3$ and about $5 \times 10^{19}/cm^3$. In accordance with alternative embodiments in which an avalanche photo diode is desirable, the doping concentration of p-type germanium region 46p and n-type germanium region 46n may be greater than about $1 \times 10^{17}/cm^3$, so that the effective intrinsic germanium region 46 becomes narrow, which results in a higher electric field in the intrinsic germanium region 46. In accordance with some embodiments, the doping width $W_{dope}$ is smaller than about 120 nm, and may be in the range between about 20 nm and about 200 nm. Other values are also within the scope of the present disclosure. It has been found that selecting the doping width $W_{dope}$ as being around 100 nm may improve the device speed. If doping width $W_{dope}$ is too large, such as greater than about 200 nm, the device speed will degrade due to the scattering of carriers. On the other hand, if doping width $W_{dope}$ is too small such as smaller than about 20 nm, the improvement effect is too small and unable to justify the cost of doping.

Figure 9A:
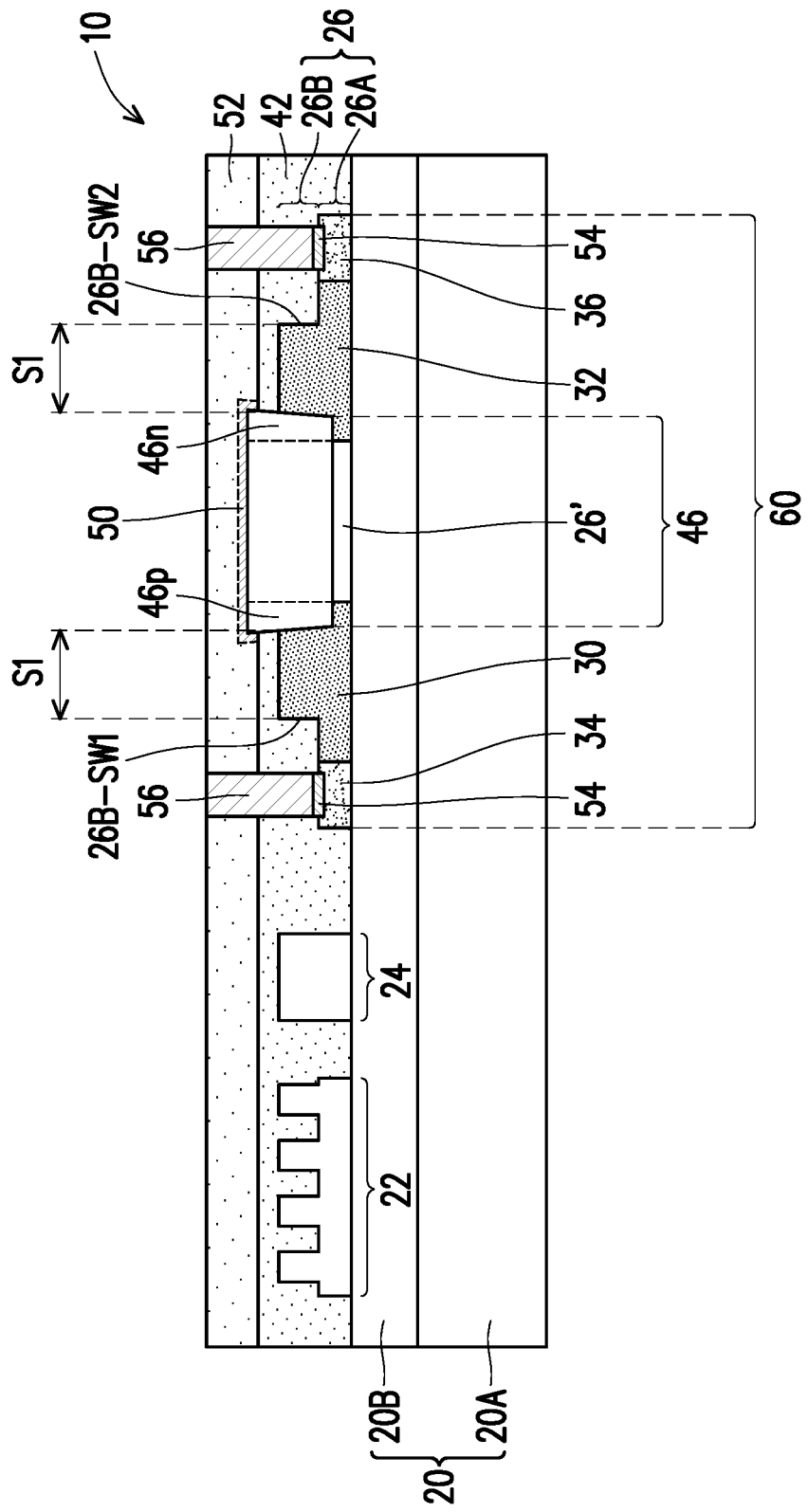

FIG. 9A illustrates the formation of dielectric layer 52, silicide regions 54, and contact plugs 56. The respective process is illustrated as process 220 in the process flow 200 as shown in FIG. 16. In accordance with some embodiments, dielectric layer 52 is formed of silicon oxide, silicon nitride, silicon oxynitride, or the like. The formation of silicide regions 54 may include etching dielectric layers 52 and 42 to form contact openings and to reveal p+ region 34 and n+ region 36, depositing a metal layer such as a titanium layer extending into the contact openings, and performing an anneal process to react the metal layer with the exposed p+ region 34 and n+ region 36. The formation of the contact plugs may include depositing a metal such as tungsten, cobalt or the like into the contact openings, and then performing a planarization process such as a CMP process or a mechanical grinding process to remove the excess portions of the deposited metal. Germanium photodetector 60 is thus formed.

As shown in FIG. 9A, germanium photodetector 60 includes intrinsic silicon region 26', which is the undoped portion of the original silicon region 26. Accordingly, intrinsic silicon region 26' may be free from, or may be lightly doped with, one or both of p-type and n-type impurity, as aforementioned. P-type region 30 and n-type region 32 form a p-i-n photo diode with intrinsic silicon region 26'. In the operation of the germanium photodetector 60, light goes into germanium region 46, and electrons and holes are generated in germanium region 46. A strong electric field is generated in intrinsic germanium region 46, and the electrons and holes generated by germanium region 46 are swept by the electric field to contact plugs 56.

Figure 9B:
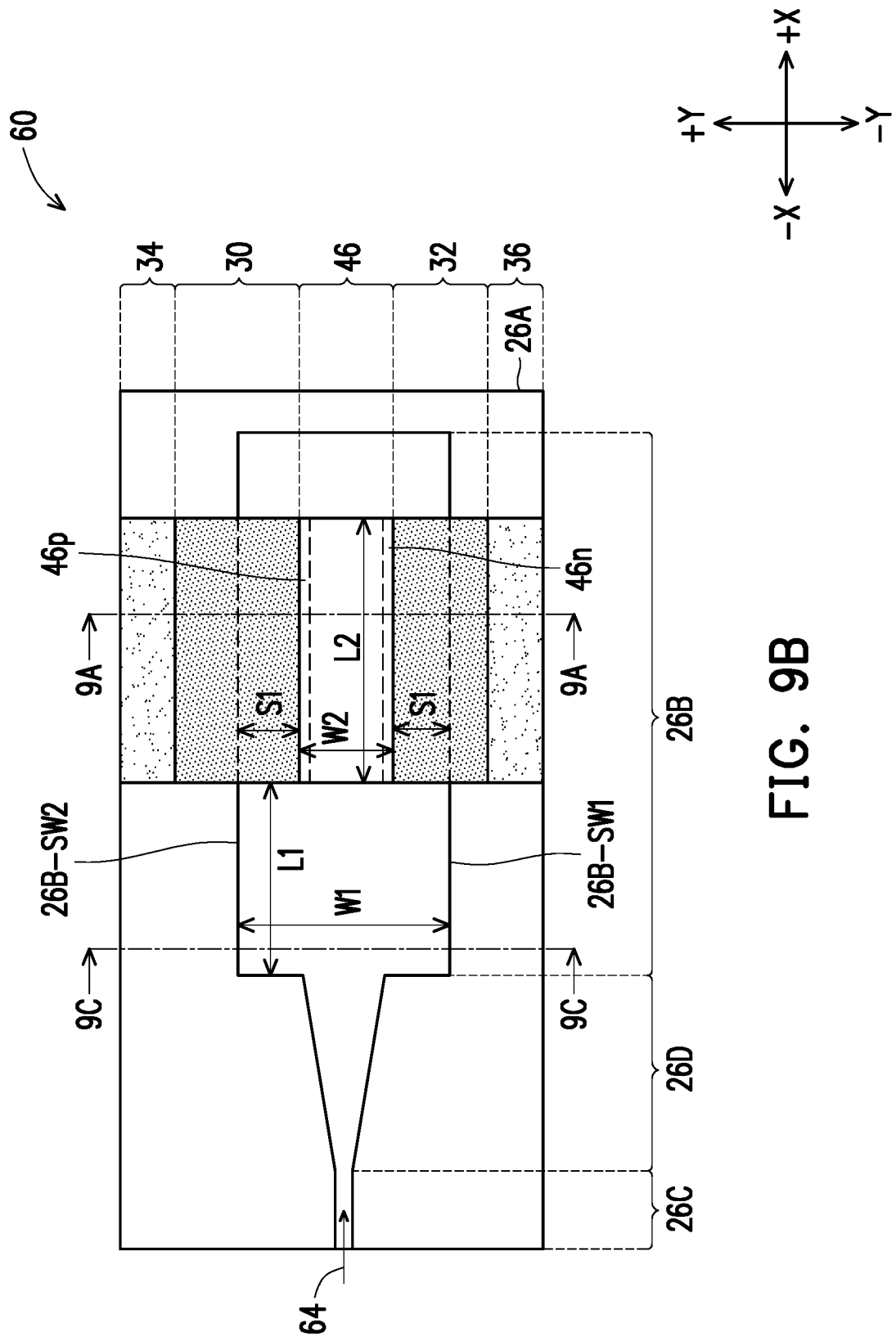

FIG. 9B illustrates a top view of the germanium photodetector 60 as shown in FIG. 9A, wherein the cross-sectional view shown in FIG. 9A is obtained from the reference cross-section 9A-9A as shown in FIG. 9B. As shown in FIG. 9B, the upper silicon region over silicon slab 26A includes waveguide 26C and tapered region 26D for conducting light to germanium photodetector 60. Waveguide 26C and tapered region 26D are also the input port of the germanium photodetector 60. Tapered region 26D has the function of spreading light from the narrow waveguide 26C to a larger area in silicon region 26B. In accordance with some embodiments, the tapered region 26D is not adopted, and waveguide 26C having a uniform width is connected directly to silicon region 26B.

In accordance with some embodiments, the width W1 of silicon region 26B is significantly greater than the width W2 of germanium region 46. In accordance with some embodiments, the silicon region 26B laterally extends beyond the edges of germanium region 46 in the +Y direction and –Y direction for a distance S1, which is significant enough to allow adequate room for the light input from input port 26C/26D to spread in the +Y direction and –Y direction. In accordance with some embodiments, the input light 64 has a single mode, which is referred to as a fundamental mode. When light 64 goes into silicon region 26B, since silicon region 26B has large width W1, the light with higher-order modes such as first-order mode, second-order mode, third-order mode, fourth order-mode, and so on, are excited. The resulting light, having the fundamental mode and the higher-order modes, thus becomes multi-mode light in silicon region 26B. These modes interfere inside the region 26B and forms different orders of self-images. Accordingly, silicon region 26B is referred to as Multi-Mode Interferometer (MMI) region hereinafter.

In accordance with some embodiments, in order to be able to achieve desired optical power distribution, a proper value is selected for spacing S1. Spacing S1 cannot be too large or too small. If spacing S1 is too smaller, for example, smaller than 0.2 μm, the light power is not redistributed wide enough (discussed in detail in subsequent paragraphs). As a result, most of the light travels in the +x direction hits germanium region 46 head-on. Most part of the light power is thus absorbed by the front-end (the end facing input waveguide 26C) of the germanium region 46. This results in the saturation power of the device to be undesirably low, and the speed of the photodetector is also reduced. If the Spacing S1 is too large, the light power is redistributed too much and spread too much, and a significant part of the light, when propagates in the +X direction, passes through the spacing S1 without hitting germanium region 46 for an extend travel distance. The light absorption is low. As a result, the length L2 of germanium region needs to be increased too much to allow the adequate absorption of light by germanium region 46. Accordingly, in accordance with some embodiments, spacing S1 is in the range between about 0.4 μm and about 1.5 μm. Other values are also within the scope of the present disclosure.

The multi-mode light, when spreads in the +Y and –Y directions, will be reflected at the opposing sidewalls 26B-SW1 and 26B-SW2 of MMI region 26B, and hence interference is resulted to form an interference pattern. Sidewalls 26B-SW1 and 26B-SW2 of MMI region 26B interfaces with the sidewalls of dielectric region 42, as shown in FIG. 9A. The power of the light is thus redistributed in the silicon region 26. Accordingly, the front-end of germanium region 46 receives adequate, but not excessive amount of light. The light, when reflected back-and-forth in MMI region 26B when propagating in the +X direction, will be gradually absorbed by the front portion, middle portion, and the back portion of germanium region 46. Therefore, by adopting the MMI structure, the light is absorbed more uniformly by different portions (front portions, middle portions, and back portions) of germanium region 46. Accordingly, the saturation power of the resulting germanium photodetector 60 is increased, and the light with higher power may be used on photodetector 60 without causing saturation. The speed of germanium photodetector 60 is also increased. In addition, by adopting the MMI structure, a smaller portion of light hits the Si—Ge interface and gets reflected to the input, which leads to the reduction of back-reflection from the photodetector 60. Accordingly, the increase in the width W1 of the MMI region 26B also helps the reduction in the reflection.

Length L1, which is the distance from the input port of MMI region 26B to germanium region 46, is referred to as the free-propagation length (of light). Free-propagation length L1 cannot be too small. Otherwise, there is not enough distance for light to spread out in the +Y and −Y directions, and high-order modes cannot be excited. Also, there is too strong reflection from germanium region 46 if free-propagation length L1 is too small. In accordance with some embodiments of the present disclosure, free-propagation length L1 is greater than about 1 μm to allow multi-mode to be excited. Also, when width W1 is greater, greater L1 is used. A too large free-propagation length L1 also results in the increase of the size of the germanium photodetector 60 without additional benefit. Accordingly, in accordance with some embodiments, free-propagation length L1 is in the range between about 1 μm and about 10 μm. Other values are also within the scope of the present disclosure.

With the light being redistributed under the multi-mode, in accordance with some embodiments, length L2 of germanium region 46 may be greater than about 10 μm in order to substantially fully absorb the light (for example, with absorption rate being greater than 99 percent). Too large length L2 is also undesirable since it results in the size of multi-mode germanium photodetector to be increased without added benefit. Length L2 may be in the range between about 10 μm and about 50 μm in accordance with some embodiments. Width W2 of germanium region 46 may be in the range between about 0.3 μm and about 1.5 μm in accordance with some embodiments. Other values are also within the scope of the present disclosure.

The dimensions such as width W1 and lengths L1 and L2 may be engineered to obtain optimum result, so that the absorption of light by germanium region 46 across the entire length L2 is more uniform. For example, W1 and length L1 may be selected so that the front end of germanium region 46 is situated in a moderately high E-field region of the light. Also, length L2 may be adjusted to have a minimum length to reduce the size of the photodetector 60, while is still long enough to substantially fully absorb the light.

Figure 9C:
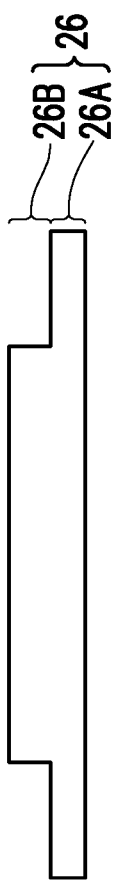

FIG. 9C illustrates a cross-sectional view obtained from the reference cross-section 9C-9C in FIG. 9B. FIG. 9C illustrates the shape of silicon slab 26A and the free-propagate part of MMI region 26B in accordance with some embodiments.

Figure 10:
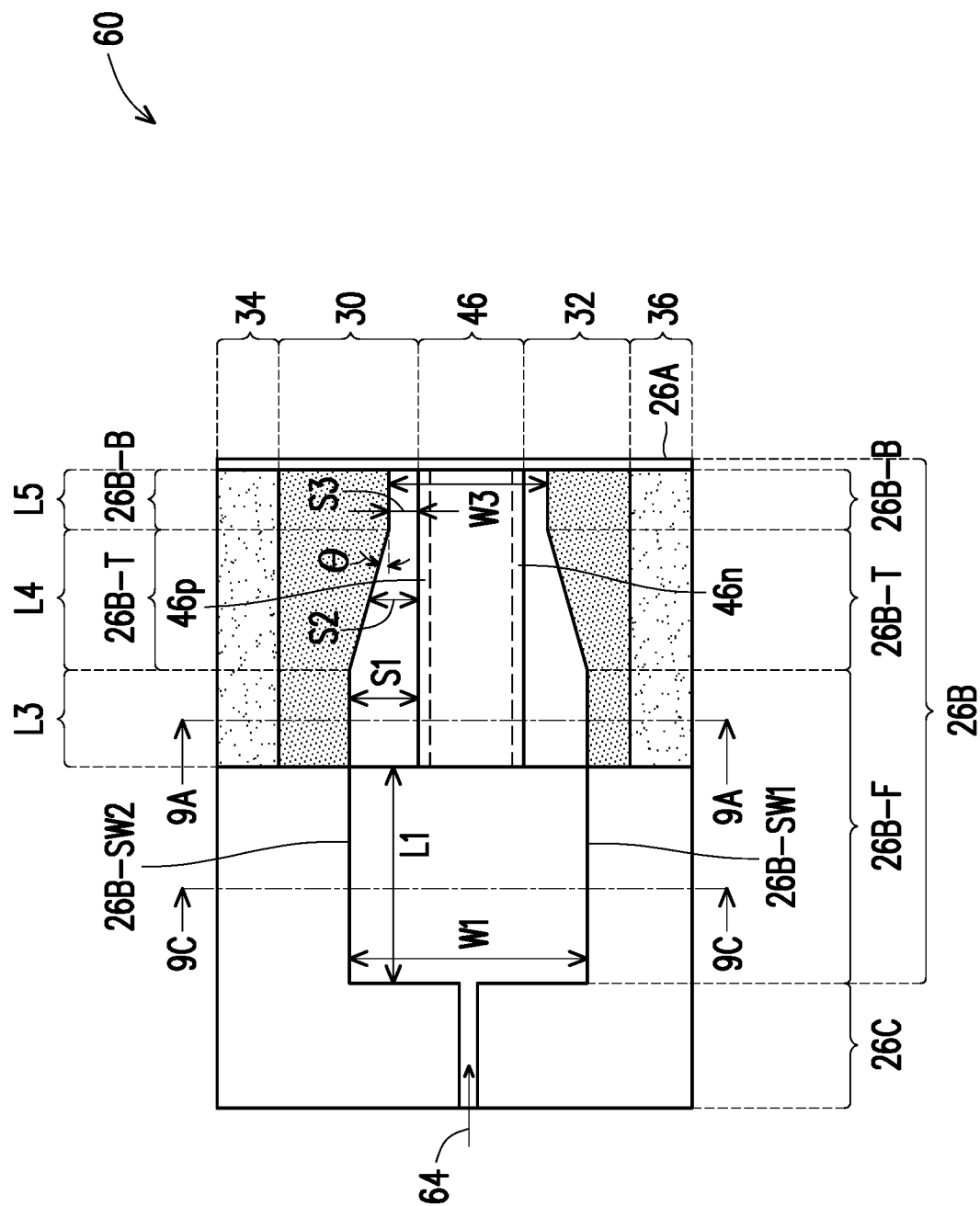
FIGS. 10, 11, and 12 illustrate the plane views of multi-mode germanium photodetectors in accordance with some embodiments.

FIGS. 10 through 14 illustrate the top views of multi-mode germanium photodetectors 60 in accordance with alternative embodiments of the present disclosure. Unless specified otherwise, the materials and the formation processes of the components in these embodiments are essentially the same as the like components in preceding figures except that the pattern of the lithography masks used in the etching processes for forming the structure shown in FIG. 2A are modified to form the structures shown in FIGS. 10 through 14. Accordingly, the components in FIGS. 10 through 14 are denoted by like reference numerals in the preceding embodiments shown in FIGS. 1, 2A, 2B, 3A, 3B, 4-8, 9A, 9B, and 9C. The details regarding the formation processes and the materials of the components shown in FIGS. 10 through 14 may thus be found in the discussion of the preceding embodiments. Also, the cross-sectional views obtained from the embodiments shown in FIGS. 10 through 14 are also the same as shown in FIGS. 9A and 9C. For example, FIG. 10 schematically illustrates reference cross-sections 9A-9A and 9C-9C, and the cross-sectional views obtained from these cross-sections are the same as shown in FIGS. 9A and 9C, respectively.

In the multi-mode germanium photodetectors 60 as shown in FIG. 10, the MMI region 26B has a front portion with width W1, and back portions are tapered to have width W3. Due to the separation of germanium region 46, two back portions 26B-B of MMI region 26B are on the opposing sides of germanium region 46. There is a tapered portion 26B-T on each side of germanium region 46 for connecting front portion 26B-F to back portion 26B-B. In accordance with some embodiments, spacing S3 of back portion 26B-B is smaller than spacing S1 of the front portion. In accordance with some embodiments, ratio S3/S1 is in the range between about 0.1 and about 0.5. In the tapered regions 26B-T, spacings S2 may continuously reduce from S1 to S3. In accordance with some embodiments, spacing S2 of the tapered portion reduces linearly, which means the respective portions of sidewall 26B-SW1 and 26B-SW2 are straight in the top view. In other embodiments, the sidewalls of the tapered portions may have other shapes such as being curved. It is appreciated that spacings S1, S2, and S3 are also the widths of the portions of MMI region on a side of germanium region 46. In the top view, the portions of sidewall 26B-SW1 and 26B-SW2 of tapering portion 26B-T form angle θ with the portions of the sidewall of back portion 26B-B. In accordance with some embodiments of the present disclosure, angle θ is smaller than about 10 degrees in order to reduce the reflection of the light back to the input end. Angle θ may be in the range between about 1 degree and about 20 degrees in accordance with some embodiments. Other values are also within the scope of the present disclosure.

The tapered portions 26B-T has the function of confining and squeezing light from a wide region (with width W1) toward germanium region 46, and squeeze the light to a narrower region with spacing S1, so that light is confined into narrower regions with spacings S2 and S3. The light intensity in the tapered portion 26B-T and the back portion 26B-B is thus increased compared to if the light is not confined and squeezed, and the light absorption efficiency is increased. The length L4 of the tapered portions 26B-T is preferably short, so that the compression of light is finished in a short distance, providing the tapering doesn't cause the reflection of light (to input port) to increase. In accordance with some embodiments, length L4 is in the range between 50 percent and about 200 percent of free-propagation length L1.

The length L3 is related to length L1, and it is desirable that (L1+L3) is large enough so that at the right end of the front portion 26B-F, a majority (but not excessive) portion of the light power, such as in the range between about 50 percent and about 90 percent, has been absorbed by the germanium region 46. It is noted that carefully tuning the length of L3 may advantageously increase the saturation power of light due to the improvement in the absorption uniformity. With carefully selected lengths L1, L3, and L4, it is possible to reduce the length L5 of the back portions 26B-B.

Figure 15:
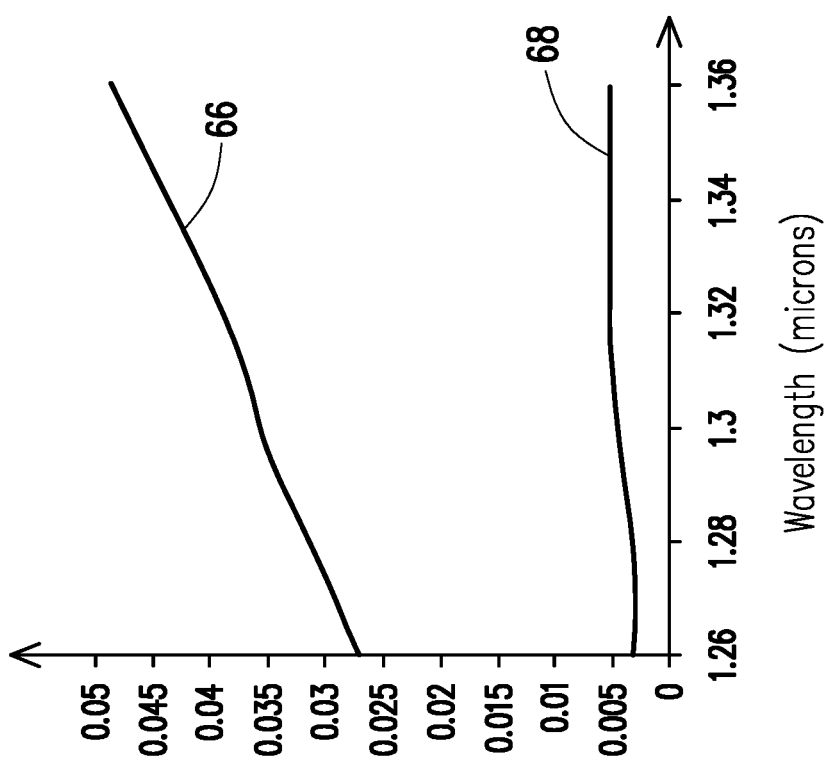
FIG. 15 illustrates the leakage of two photodetectors (with and without taper-down structures) as functions of wavelengths in accordance with some embodiments.

FIG. 15 illustrates the rates of light leakage out of the MMI region 26B as a function of the wavelength (lambda) of the light. Two lines 66 and 68 are illustrated, with the line 66 being simulated from the structure without the taper-down structure (such as in FIG. 9B), and line 68 being simulated from the structure having the taper-down structure (such as in FIG. 10). The results indicate that with the taper-down structure being used, the leakage is significantly reduced for a large span of light wavelength (from 1.26 μm to 1.36 μm). The simulation results also revealed that with selected lengths L3 and L4, the light leakage (the remaining unabsorbed light power at the end of MMI region 26B) is reduced by 10 dB when length L5 (FIG. 10) is 5 μm.

Figure 11:
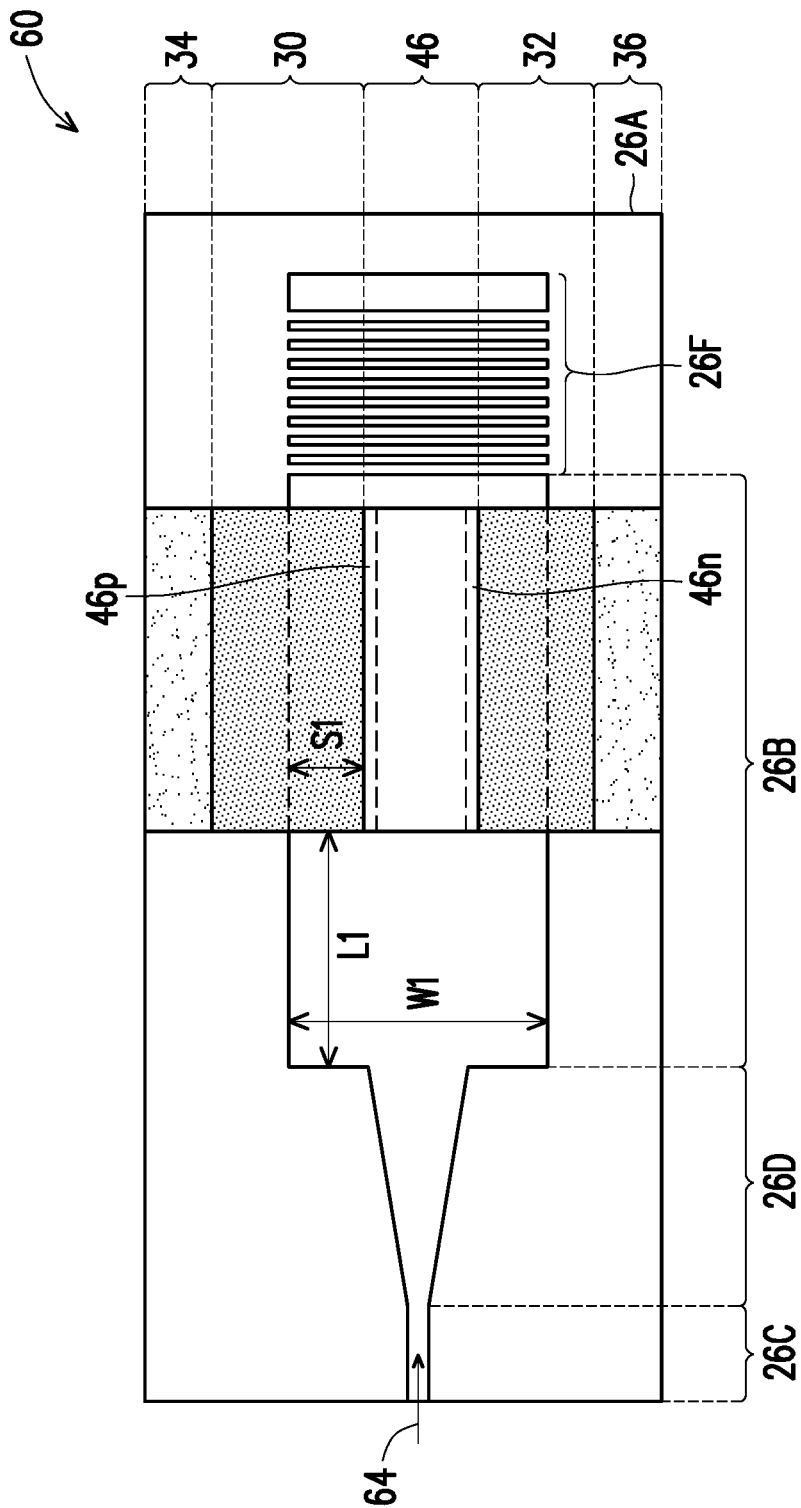
Figure 12:
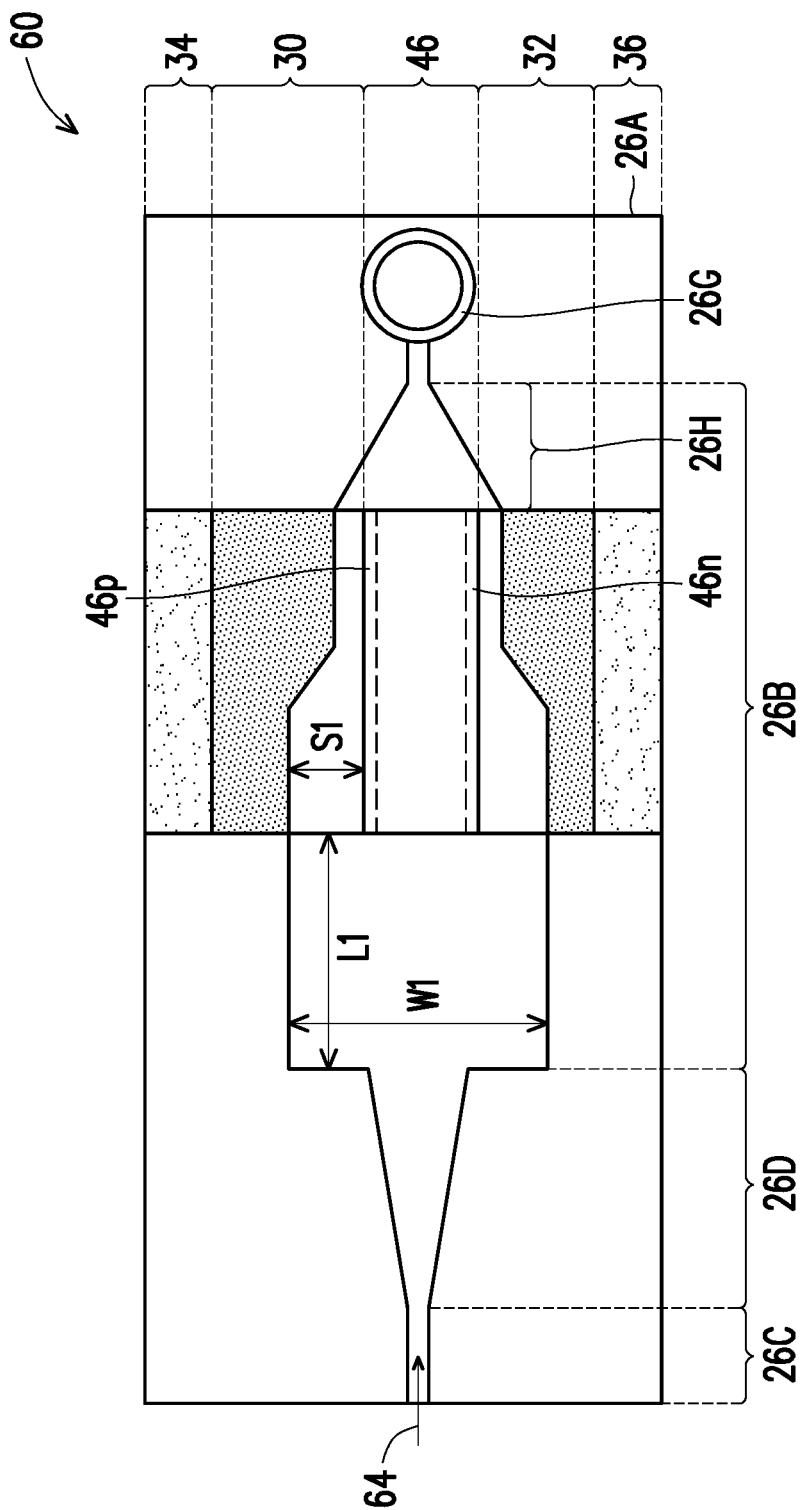

FIGS. 11 and 12 illustrate multi-mode germanium photodetectors 60 in accordance with some embodiments, in which reflectors are formed to reflect the light that otherwise will be leaked. In FIG. 11, a reflecting grating 26F is used for the reflection. In FIG. 12, a waveguide loop 26G is used to conduct the light through a loop back to MMI region 26B. In accordance with some embodiments, another tapered region 26H is connected to the end of MMI region 26B to concentrate light first, and the concentrated light is conducted into waveguide loop 26G. The reflecting grating 26F and the waveguide loop 26G may also be formed by patterning silicon region 26 (FIG. 1) in the same process for forming MMI region 26B.

Figure 13:
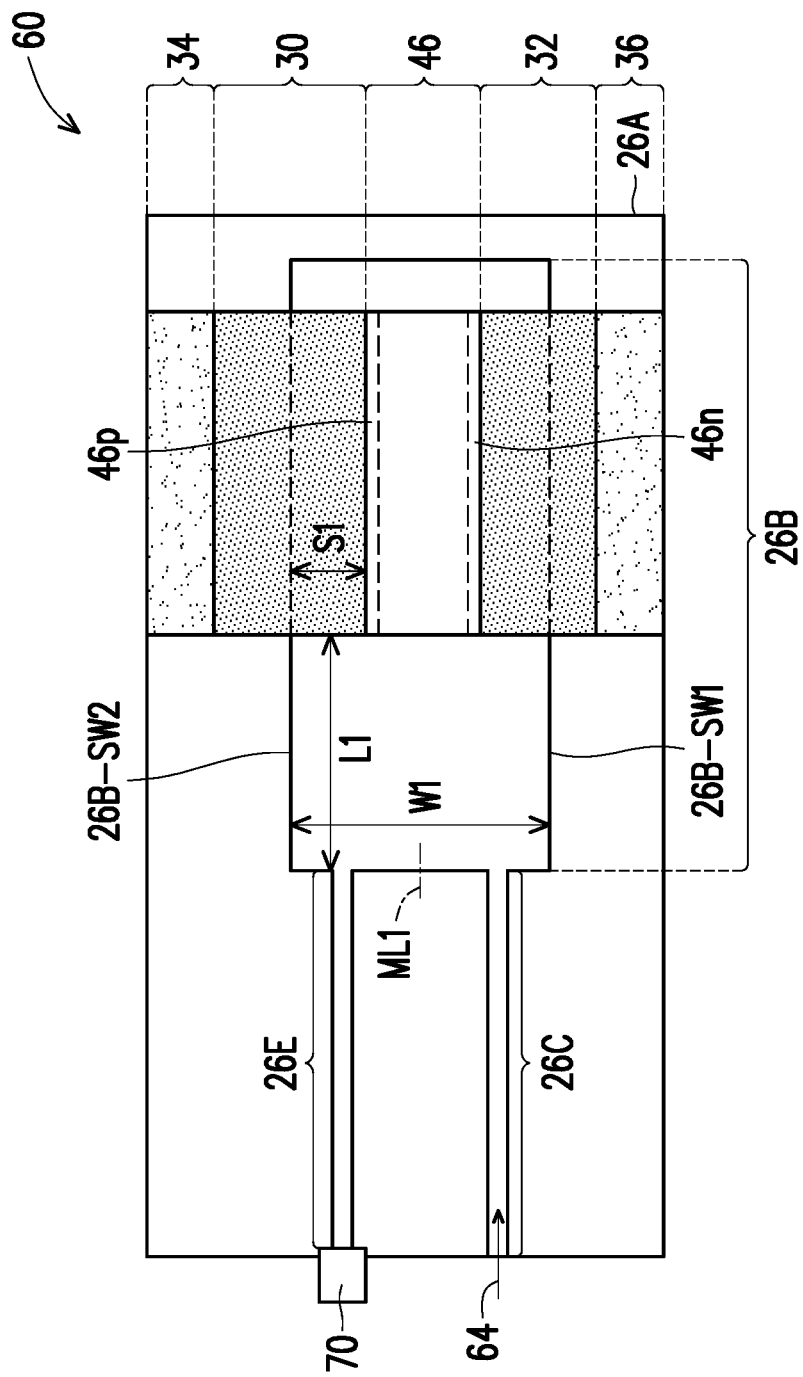
FIGS. 13 and 14 illustrate the plane views of germanium multi-port multi-mode photodetectors in accordance with some embodiments.
Figure 14:
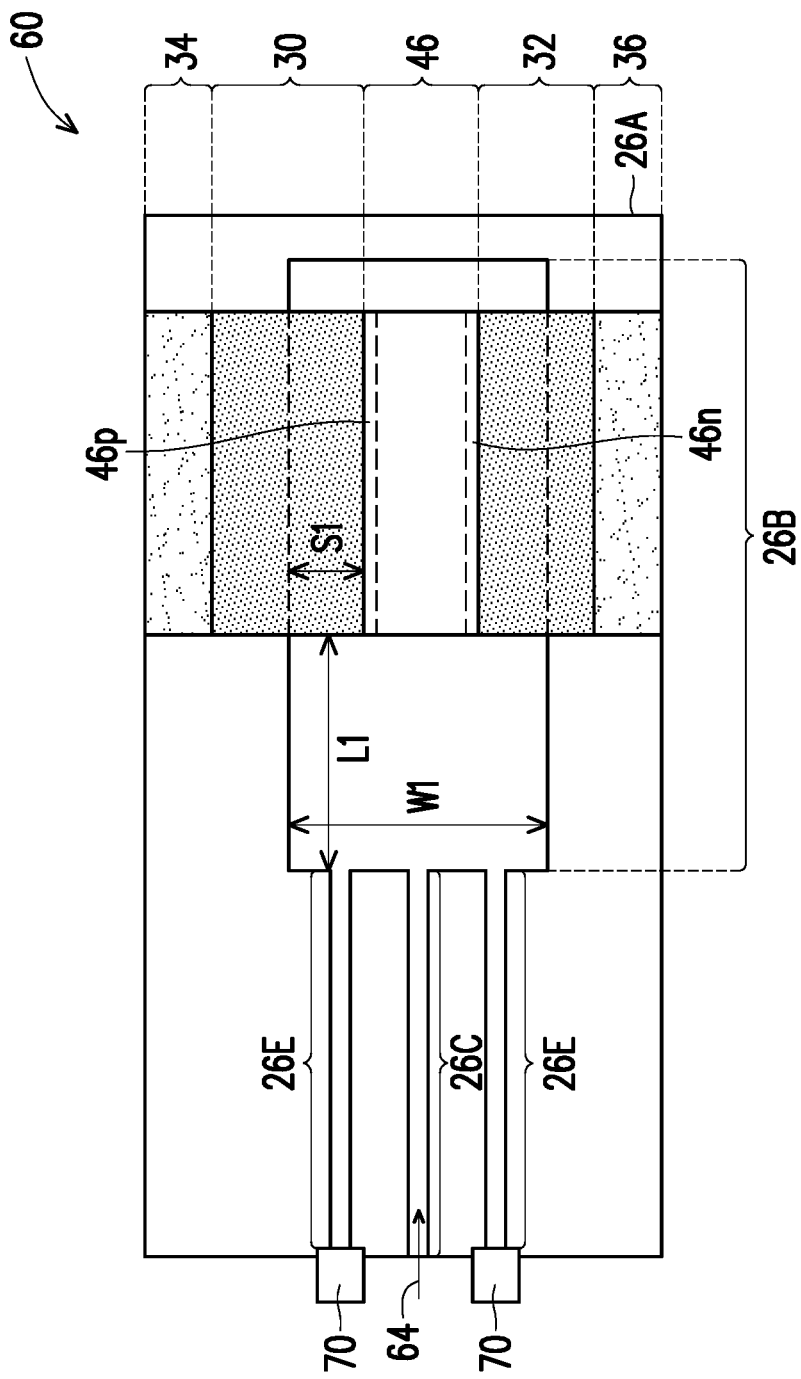

FIGS. 13 and 14 illustrate multi-port multi-mode germanium photodetectors 60 in accordance with alternative embodiments of the present disclosure. The formation of the wide MMI region 26B enables the addition of more ports being used as input or reflection collection. For example, FIG. 13 illustrates a two-port multi-mode germanium photodetector 60, which includes port 26C and port 26E. Light can be input through port 26C or port 26E, or through both ports depending on the application. In the case of single input using port 26C, port 26E can be used for collecting the reflected light. In accordance with some embodiments, a terminator 70 is connected to the reflection port 26E, and is used for absorbing the light received from reflection port 26E. In accordance with some example embodiments, the terminator 70 may be a silicon region with a high doping concentration of phosphorus, for example, with the doping concentration higher than about $10^{20}/cm^3$.

The position of the port 26C is offset from the center line ML1, which is in the middle of the sidewall 26B-SW1 and the middle line ML1 of MMI region 26B. In accordance with some embodiments, input port 26C may be in the middle of sidewall 26B-SW1 and middle line ML1. Reflection port 26E may be in the middle of the sidewall 26B-SW2 and middle line ML1. In accordance with other embodiments, the position of input port 26C is adjusted to be offset from the middle of sidewall 26B-SW1 and middle line ML. Simulation results have revealed that by carefully selecting the position of input port 26C, the E-field of the interfered multi-mode light may have two peaks separated from each other. When the first peak oscillates to sidewall 26B-SW1, the second peak may fall on germanium region 46, so that its power is absorbed, and when the second peak oscillates to sidewall 26B-SW2, the first peak may fall on germanium region 46, so that its power is absorbed. Accordingly, by electing the positions of input port 26C, at the front end of germanium region 46, the light intensity is effectively reduced by a half, and hence the absorption of light by the front portion of germanium region 46 is reduced, hence the saturation power of the multi-port multi-mode germanium photodetectors 60 is improved.

In accordance with some embodiments, to incorporate the multiple ports, the width W1 and the free-propagation length L1 of MMI region 26B may be further increased. For example, the width W1 of the MMI region may be increased to be in the range between about 1.5 μm and about 4 μm. The free-propagation length L1 may be increased to be in the range between about 1 μm and about 20 μm. Other values are also within the scope of the present disclosure.

It is appreciated that there may be more ports added. The total number of ports thus may also be three, four, five, or more. Among these ports, one or more can be used as the input, and the others can be used as reflection ports for collecting the reflected light. For example, FIG. 14 illustrates a three-port multi-mode germanium photodetectors 60 as an example. FIG. 14 illustrates that the port 26C is used as input port and is in the middle of ports 26E, which are used as reflection ports, in accordance with some embodiments. In accordance with some embodiments, input port may be in any other positions such as in the position of any of the illustrated reflection ports 26E in FIG. 14. The ports in the preceding embodiments may be distributed symmetrically, or asymmetrically. For example, the input port 26C may be in the middle of MMI region 26B, or the position of input port 26C may be switched with any of the reflection ports 26E. In accordance with other embodiments, both of the ports 26E can be used as input and 26C is used as reflection port The embodiments of the present disclosure have some advantageous features. Germanium has a strong absorption coefficient in the wavelength range of 1,200 nm to 1,600 nm, which is a widely used range in optical applications. The strong absorption coefficient may lead to power saturation and speed degradation when the input power is high. In accordance with some embodiments of the present disclosure, since the optical field intensity in the multi-mode germanium photodetectors is re-distributed, by properly locating the germanium region, light is absorbed more uniformly by the front portion, middle portion and the back portion of the germanium region. Accordingly, the saturation power of the germanium photodetector is increased. The speed of the photodetector is also increased, especially at high optical input. The reflection is reduced by about 10 dB compared to the single-mode germanium photodetectors. Also, the capping layer applies a stress on the germanium region, which enhances the optical absorption coefficient of germanium around the C-band of 1,550 nm, and hence the coverage of germanium absorption at the C-band is enlarged. The photodetector in accordance with the embodiments of the present disclosure is well-suited for the bandwidth from about 1,200 nm to about 1,600 nm. Also, since the MMI regions are wider and extend beyond the germanium regions for a significant distance, the process for forming the germanium photodetector has a more relaxed process margin.

In accordance with some embodiments of the present disclosure, a method comprises etching a silicon layer to form a silicon slab and an upper silicon region over the silicon slab; implanting the silicon slab and the upper silicon region to form a p-type region; an n-type region; and an intrinsic region between the p-type region and the n-type region; etching the p-type region, the n-type region, and the intrinsic region to form a trench, wherein remaining portions of the upper silicon region form a MMI region; performing an epitaxy process to grow a germanium region in the trench; and forming electrical connections connecting to the p-type region and the n-type region. In an embodiment, the MMI region comprises a first remaining portion of the p-type region and a second remaining portion of the n-type region on opposing sides of the germanium region, and wherein outer sidewalls of the first remaining portion and the second remaining portion are spaced apart from the germanium region by spacings greater than about 0.4 μm. In an embodiment, the method further comprises depositing a capping layer on the germanium region; and depositing a dielectric layer on a top surface and sidewalls of the capping layer. In an embodiment, the capping layer comprises silicon nitride, and the dielectric layer comprises silicon oxide. In an embodiment, a sidewall of the MMI region comprises a front part having a first spacing from a respective sidewall of the germanium region; a back part having a second spacing from the respective sidewall of the germanium region, wherein the second spacing is smaller than the first spacing; and a tapered part connecting the front part to the back part, wherein the tapered part has third spacings from the respective sidewall of the germanium region, and the third spacings transition from the first spacing to the second spacing. In an embodiment, the method further comprises depositing an isolation region surrounding the silicon slab and the upper silicon region, wherein the isolation region has a first refraction index smaller than a second refraction index of the upper silicon region. In an embodiment, the etched silicon layer results in multiple ports that can be used as input ports and reflection ports.

In accordance with some embodiments of the present disclosure, a device comprises a P-I-N diode, which comprises a p-type region; an n-type region; and an intrinsic region between the p-type region and the n-type region; a germanium region extending into the P-I-N diode; and an input port, wherein the P-I-N diode and the germanium region in combination form a multi-mode interferometer configured to excite a single-mode from an input light that is input from the input port to a light having high-order modes. In an embodiment, the device further comprises a first portion of the p-type region is on a first side of the germanium region, and a second portion of the n-type region is on a second side of the germanium region, and the first portion and the second portion have outer edges spaced apart from respective close edges of the germanium by spacings greater than about 0.4 µm. In an embodiment, the P-I-N diode comprises a silicon slab and an upper silicon region over the silicon slab, wherein the germanium region penetrates through the upper silicon region, and the upper silicon region comprises a front part having a first width; a back part having a second width smaller than the first width; and a tapered part connecting the front end to the back end, wherein the tapered part has widths transitioning from the first width to the second width. In an embodiment, the device further comprises a first dielectric layer, with the P-I-N diode being in the first dielectric layer; a capping layer on the germanium region; and a second dielectric layer on a top surface and sidewalls of the capping layer. In an embodiment, the capping layer comprises silicon nitride, and the first dielectric layer and the second dielectric layer comprise silicon oxide. In an embodiment, the device further comprises an input port; and a reflection port on a same side of the germanium region as the input port.

In accordance with some embodiments of the present disclosure, a device comprises a silicon region, which comprises a silicon slab; an upper silicon region over and joining the silicon slab, wherein the silicon region forms a P-I-N diode extending into both of the silicon slab and the upper silicon region; and a germanium region penetrating through the upper silicon region, wherein the upper silicon region comprises a multi-mode interferometer region, which comprises a first portion on a first side of the germanium region; a second portion on a second side of the germanium region opposing the first side; and an input port connected to the upper silicon region. In an embodiment, the multi-mode interferometer region further comprises a free-propagation region between the input port and the germanium region, and the free-propagation region has a length greater than about 1 µm. In an embodiment, the device further comprises a reflection port connecting to same sidewall of the multi-mode interferometer region. In an embodiment, the multi-mode interferometer region comprises a front portion; and a back portion narrower than the front portion. In an embodiment, the multi-mode interferometer region further comprises a tapered portion connecting the front portion to the back portion. In an embodiment, the device further comprises a capping layer over and contacting the germanium region, wherein the capping layer is configured to apply a stress on the germanium region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
   a diode comprising:
      a p-type region;
      an n-type region; and
      an intrinsic region between the p-type region and the n-type region;
   a silicon slab;
   an upper silicon region over the silicon slab, wherein the upper silicon region comprises:
      a front part having a first width;
      a back part having a second width greater than the first width; and
      a tapered part connecting the front part to the back part, wherein the tapered part has widths transitioning from the first width to the second width; and
   a germanium region penetrating through the upper silicon region, wherein parts of the p-type region and the n-type region are in the back part and the germanium region; and
   an input port, wherein the diode and the germanium region in combination form a photodetector configured to convert a single-mode of an input light that is input from the input port to a light having high-order modes.

2. The device of claim 1, wherein a first portion of the p-type region is on a first side of the germanium region, and a second portion of the n-type region is on a second side of the germanium region, and the first portion and the second portion have outer edges spaced apart from respective closest edges of the germanium region by spacings greater than about 0.4 µm.

3. The device of claim 2, wherein the spacings are in a range between about 0.4 µm and about 1.5 µm.

4. The device of claim 1 further comprising:
   a first dielectric layer, with the diode being in the first dielectric layer;
   a capping layer on the germanium region; and
   a second dielectric layer on a top surface and sidewalls of the capping layer.

5. The device of claim 4, wherein the capping layer comprises silicon nitride, and the first dielectric layer and the second dielectric layer comprise silicon oxide.

6. The device of claim 1, wherein parts of the p-type region, the n-type region, and the intrinsic region are parts of the germanium region.

7. A device comprising:
- a silicon region comprising:
  - a silicon slab;
  - an upper silicon region over and joining the silicon slab, wherein the silicon region forms a diode extending into both of the silicon slab and the upper silicon region; and
- a germanium region penetrating through the upper silicon region, wherein the upper silicon region comprises a multi-mode interferometer region comprising:
  - a first portion on a first side of the germanium region;
  - a second portion on a second side of the germanium region opposing the first side, wherein in a top view of the device, a first center of the first portion and a second center of the second portion are aligned to a first straight line; and
  - an input port connected to the upper silicon region, wherein the multi-mode interferometer region comprises:
    - a front portion;
    - a back portion narrower than the front portion; and
    - a tapered portion connecting the front portion to the back portion, wherein the front portion, the back portion, and the tapered portion are aligned to a second straight line in the top view of the device, with the second straight line being perpendicular to the first straight line in the top view.

8. The device of claim 7, wherein the multi-mode interferometer region further comprises a free-propagation region between the input port and the germanium region, and the free-propagation region has a length greater than about 1 μm.

9. The device of claim 7 further comprising a capping layer over and contacting the germanium region, wherein the capping layer is configured to apply a stress on the germanium region.

10. The device of claim 7, wherein a part of the front portion and a part of the back portion are in the germanium region.

11. The device of claim 7, wherein in the top view, the germanium region is encircled by the upper silicon region.

12. A device comprising:
- a silicon region comprising:
  - a lower portion; and
  - an upper portion narrower than the lower portion, wherein the upper portion is over and joined to the lower portion, and wherein the upper portion comprises:
    - a first portion having a first width;
    - a second portion having a second width greater than the first width; and
    - a third portion connecting the first portion to the second portion, wherein the third portion has gradually increased widths; and
- a germanium region penetrating through the upper portion and extending into an upper layer of the lower portion of the silicon region, wherein the germanium region is encircled by the second portion.

13. The device of claim 12, wherein the germanium region comprises a diode therein.

14. The device of claim 13, wherein the diode is a P-I-N diode.

15. The device of claim 12 further comprising:
- a capping layer on the germanium region; and
- a dielectric layer on a top surface and sidewalls of the capping layer.

16. The device of claim 15, wherein the capping layer comprises silicon nitride, and the dielectric layer comprises silicon oxide.

17. The device of claim 12 further comprising:
- an isolation region surrounding the silicon region, wherein the isolation region has a first refraction index smaller than a second refraction index of the silicon region.

18. The device of claim 12, wherein the lower portion of the silicon region comprises a first sidewall and a second sidewall opposite to each other, wherein the second portion comprises a third sidewall and a fourth sidewall opposite to each other, and wherein the third sidewall and the fourth sidewall are laterally recessed from respective ones of the first sidewall and the second sidewall.

\* \* \* \* \*